(12) United States Patent
Lu et al.

(10) Patent No.: US 12,051,624 B2
(45) Date of Patent: Jul. 30, 2024

(54) STACKED SEMICONDUCTOR DEVICES AND METHODS OF FORMING THEREOF

(71) Applicant: Taiwan Semiconductor Manufacturing Co., Ltd., Hsin-Chu (TW)

(72) Inventors: Tsung-Hsing Lu, Hsinchu County (TW); Jun He, Hsinchu (TW); Li-Huan Chu, Hsinchu (TW); Pei-Haw Tsao, Tai-chung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 22 days.

(21) Appl. No.: 17/387,525

(22) Filed: Jul. 28, 2021

(65) Prior Publication Data
US 2021/0358808 A1  Nov. 18, 2021

Related U.S. Application Data

(62) Division of application No. 16/559,302, filed on Sep. 3, 2019, now Pat. No. 11,081,392.

(Continued)

(51) Int. Cl.
*H01L 25/065* (2023.01)
*H01L 21/304* (2006.01)
(Continued)

(52) U.S. Cl.
CPC .......... *H01L 21/78* (2013.01); *H01L 21/3043* (2013.01); *H01L 21/76898* (2013.01);
(Continued)

(58) Field of Classification Search
CPC ................. H01L 25/0657; H01L 25/50; H01L 25/043; H01L 25/0756; H01L 2224/08145;
(Continued)

(56) References Cited

U.S. PATENT DOCUMENTS 4,612,083 A * 9/1986 Yasumoto ............... H01L 24/83
257/E21.515
8,048,778 B1 * 11/2011 Ku .......................... H01L 21/78
257/E21.599
(Continued)

FOREIGN PATENT DOCUMENTS

| CN | 1528009 A | 9/2004 |
| CN | 104347760 A | 2/2015 |

(Continued)

OTHER PUBLICATIONS

Notice of Allowance dated Jan. 13, 2023, issued by the Korean Intellectual Property Office in Korean Patent Application No. 20100035160, cover sheet and 7 pages.

*Primary Examiner* — Galina G Yushina
(74) *Attorney, Agent, or Firm* — HAYNES AND BOONE, LLP

(57) ABSTRACT

A semiconductor structure includes a first device and a second device bonded on the first device. The first device has a first sidewall distal to the second device and a second sidewall proximal to the second device. A surface roughness of the second sidewall is larger than a surface roughness of the first sidewall.

20 Claims, 24 Drawing Sheets

Related U.S. Application Data

(60) Provisional application No. 62/738,395, filed on Sep. 28, 2018.

(51) Int. Cl.
 *H01L 21/768* (2006.01)
 *H01L 21/78* (2006.01)
 *H01L 23/00* (2006.01)
 *H01L 25/00* (2006.01)

(52) U.S. Cl.
 CPC .............. *H01L 24/83* (2013.01); *H01L 24/94* (2013.01); *H01L 25/0657* (2013.01); *H01L 25/50* (2013.01)

(58) Field of Classification Search
 CPC ..... H01L 2224/16145; H01L 21/67092; H01L 2224/0401; H01L 2224/04042; H01L 21/187; H01L 21/78; H01L 21/3043; H01L 21/76898; H01L 24/83; H01L 24/94; H01L 24/81; H01L 24/05; H01L 24/80; H01L 24/08
 See application file for complete search history.

(56) References Cited

U.S. PATENT DOCUMENTS

| | | | |
|---|---|---|---|
| 8,361,828 B1 | 1/2013 | Patterson et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2001/0013425 A1* | 8/2001 | Rokugawa | H05K 3/4682 174/262 |
| 2001/0015676 A1* | 8/2001 | Takikawa | H03F 3/19 330/307 |
| 2002/0014126 A1* | 2/2002 | Okada | G01L 5/165 73/862.043 |
| 2006/0057777 A1* | 3/2006 | Howell | H01L 21/78 438/460 |
| 2006/0249851 A1* | 11/2006 | Karnezos | H01L 25/105 257/E25.023 |
| 2007/0181989 A1 | 8/2007 | Corisis et al. | |
| 2008/0272476 A1 | 11/2008 | Do et al. | |
| 2009/0194864 A1* | 8/2009 | Dang | H01L 25/0657 257/691 |
| 2011/0133339 A1* | 6/2011 | Wang | H01L 21/50 257/773 |
| 2011/0189820 A1 | 8/2011 | Sasaki et al. | |
| 2013/0234193 A1 | 9/2013 | Odnoblyudov et al. | |
| 2013/0267076 A1* | 10/2013 | Lei | B23K 26/40 438/460 |
| 2015/0072506 A1 | 3/2015 | Nomaru | |
| 2015/0104930 A1 | 4/2015 | Aikawa et al. | |
| 2015/0187650 A1 | 7/2015 | Uchida et al. | |
| 2015/0371966 A1* | 12/2015 | Yoshida | H01L 24/05 257/620 |
| 2016/0218080 A1* | 7/2016 | Tan | H01L 24/94 |
| 2017/0323840 A1* | 11/2017 | Chiu | H01L 21/568 |
| 2018/0103216 A1* | 4/2018 | Sakakibara | H04N 25/71 |

FOREIGN PATENT DOCUMENTS

| | | |
|---|---|---|
| CN | 105304617 A | 2/2016 |
| CN | 107210207 A | 9/2017 |
| JP | 2002217331 A | 8/2002 |
| JP | 2010103245 A | 10/2008 |
| JP | 2012114322 A | 6/2012 |
| JP | 2015056489 A | 9/2013 |
| JP | 2014116561 A | 6/2014 |
| JP | 2018098318 A | 12/2016 |
| JP | 2018113295 A | 7/2018 |
| KR | 20070107910 A | 11/2007 |
| KR | 20100035160 A | 1/2010 |
| KR | 20160029097 A | 3/2016 |
| TW | 201143129 | 12/2011 |
| TW | 201234463 A | 8/2012 |
| TW | 201436013 A | 9/2014 |
| TW | 201526161 A | 7/2015 |
| TW | 201546890 A | 12/2015 |

* cited by examiner

STACKED SEMICONDUCTOR DEVICES AND METHODS OF FORMING THEREOF

PRIORITY

This is a divisional application of U.S. patent application Ser. No. 16/559,302, filed on Sep. 3, 2019, which claims priority to U.S. Provisional Patent Application Ser. No. 62/738,395 filed on Sep. 28, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor technologies further advance, stacked semiconductor devices, e.g., 3D integrated circuits (3D-ICs), have emerged as an effective alternative to further reduce the physical size of a semiconductor device. In a stacked semiconductor device, wafers/dies are stacked on top of one another and are interconnected using through connections, such as a through-substrate-via (TSV). Some of the benefits of 3D-ICs, for example, include exhibiting a smaller footprint, reducing power consumption by reducing the lengths of signal interconnects, and improving yield and fabrication cost if individual dies are tested separately prior to assembly. However, there are challenges associated with dicing stacked semiconductor structures. Dicing is a process in which a chip-containing semiconductor structures (e.g., a wafer-on-wafer structure) is cut into individual dies. Mechanical dicing (such as using a saw or a blade) or laser dicing have been used in the industry for singularizing dies. When solely relying on mechanical dicing, thermal and mechanical stress during mechanical dicing may cause substrate lattice distortion and create cracks into layers containing circuits, which is termed silicon peeling. When solely relying on laser dicing, laser irradiation may create silicon debris, causing contamination to sidewalls of dice. Therefore, a need exists for a method of dicing stacked semiconductor devices without substantially causing silicon peeling and silicon debris.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
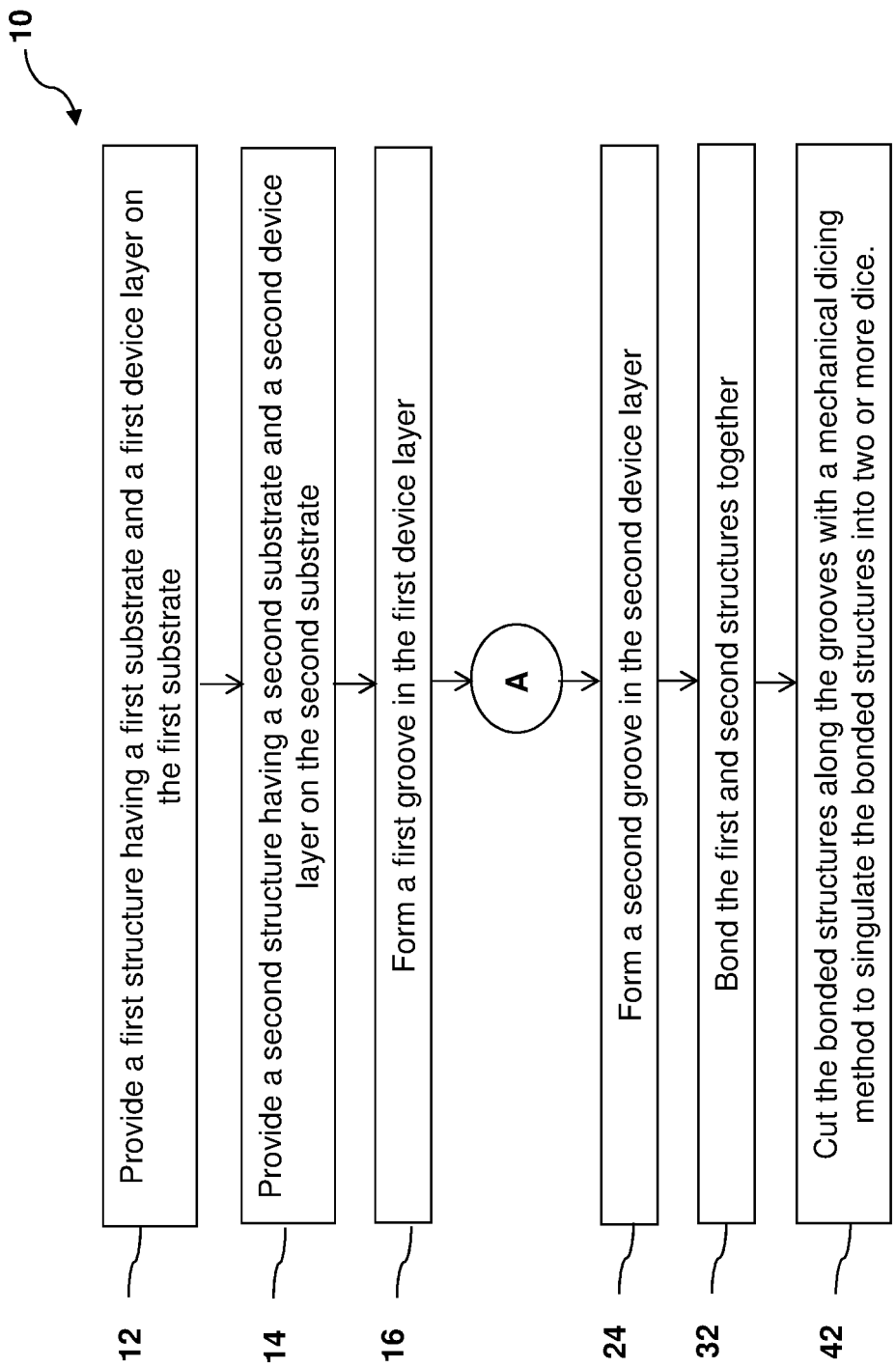
FIGS. 1A, 1B, and 1C show a flowchart of an exemplary method for fabricating a stacked semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

Upon the completion of stacked semiconductor manufacturing, a bonding process physically joins a first wafer to a second wafer, creating a wafer-on-wafer structure. The wafer-on-wafer structure includes a large number of duplicate semiconductor devices separated by scribing channels. Various techniques are employed to divide the processed wafers along the scribe channels into individual dice with each die representing a particular semiconductor chip. Popular wafer dicing techniques adopted today in the industry include mechanical dicing and laser dicing.

Mechanical dicing employs a sawing process, such as using a diamond blade or a diamond bladed saw. Scribe channels are completely cut through during a mechanical dicing to singularize dice. Alternatively, scribe channels may be substantially cut through during a mechanical dicing (i.e., a pre-cracking process) followed by a mechanical cleaving along the pre-cracked scribe channels to singularize dice. A sawing process leaves micro-cracks along the edges of the dicing cuts. These cracks can easily propagate on a wafer through unexpected crack paths, also known as silicon peeling, which may lead to significant device damages and cause device yield loss. The yield loss may become increasingly severe on wafers having devices with miniature die sizes. The effects of vibrating, shearing, and shocking accompanying a sawing operation may aggravate the cracking and create more device damages and yield losses. Also, the physical dimension of a saw or a blade limits the further scaling of the scribe channels on a wafer, which inhibits the pervasive trend of scaling down the scribe channel dimensions on a wafer and rending the maximum possible wafer area to functional semiconductor devices in advanced processing technology.

On the other hand, laser dicing employs a high-energy laser beam or pulse striking on the scribe channel, blasting the micro-structure of the wafer crystalline material and forming the dicing cuts. When laser dicing is used, the striking of high-energy laser on a wafer surface may create a large amount of wafer material particles in the ambient, also known as silicon debris. These particles may re-deposit back on the wafer and cause severe particle contaminations. Besides, the high-energy laser beam may also cause micro-cracks as a result of the localized high-heating of the wafer crystalline material.

The present disclosure is directed to methods of dicing semiconductor devices, and more particularly to methods of dicing stacked semiconductor devices, such as wafer-on-wafer structures, with a hybrid dicing process. In some embodiments, the hybrid dicing process includes a laser grooving before bonding and then followed by a mechanical dicing. The laser grooving is substantially limited to device layers without much furthering into a silicon substrate. Since device layers mainly include dielectric materials and metal traces, less silicon debris will be produced during laser grooving. Meanwhile, the mechanical dicing is limited to a silicon substrate without sawing device layers, thereby preventing micro-cracks to propagate from the silicon substrate into device layers. Accordingly, the hybrid dicing process may significantly alleviate the detrimental effects during dicing stack semiconductor devices, such as micro-cracking and silicon debris re-deposition associated with the conventional wafer dicing methods. Therefore, the hybrid dicing process would reduce the dicing-related device damage and improve product yield. These and other benefits will become evident after the discussion of various embodiments of the present disclosure as exemplified in FIGS. 1A-22.

Figure 1B:
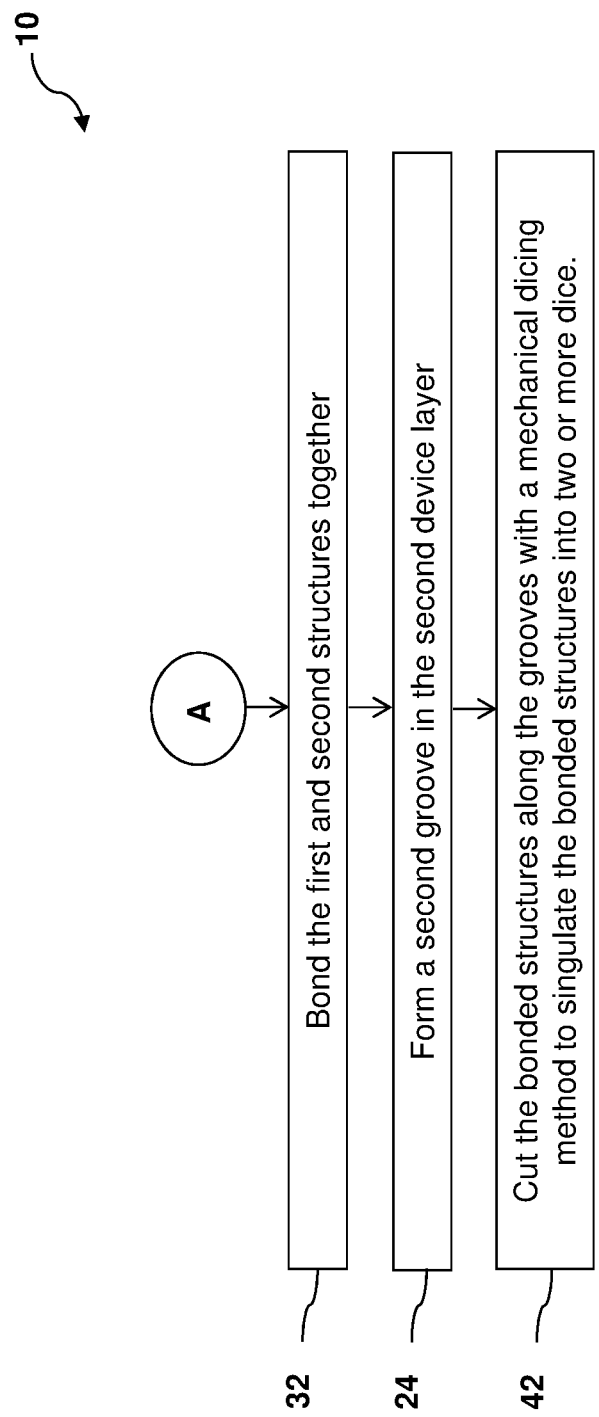
Figure 1C:
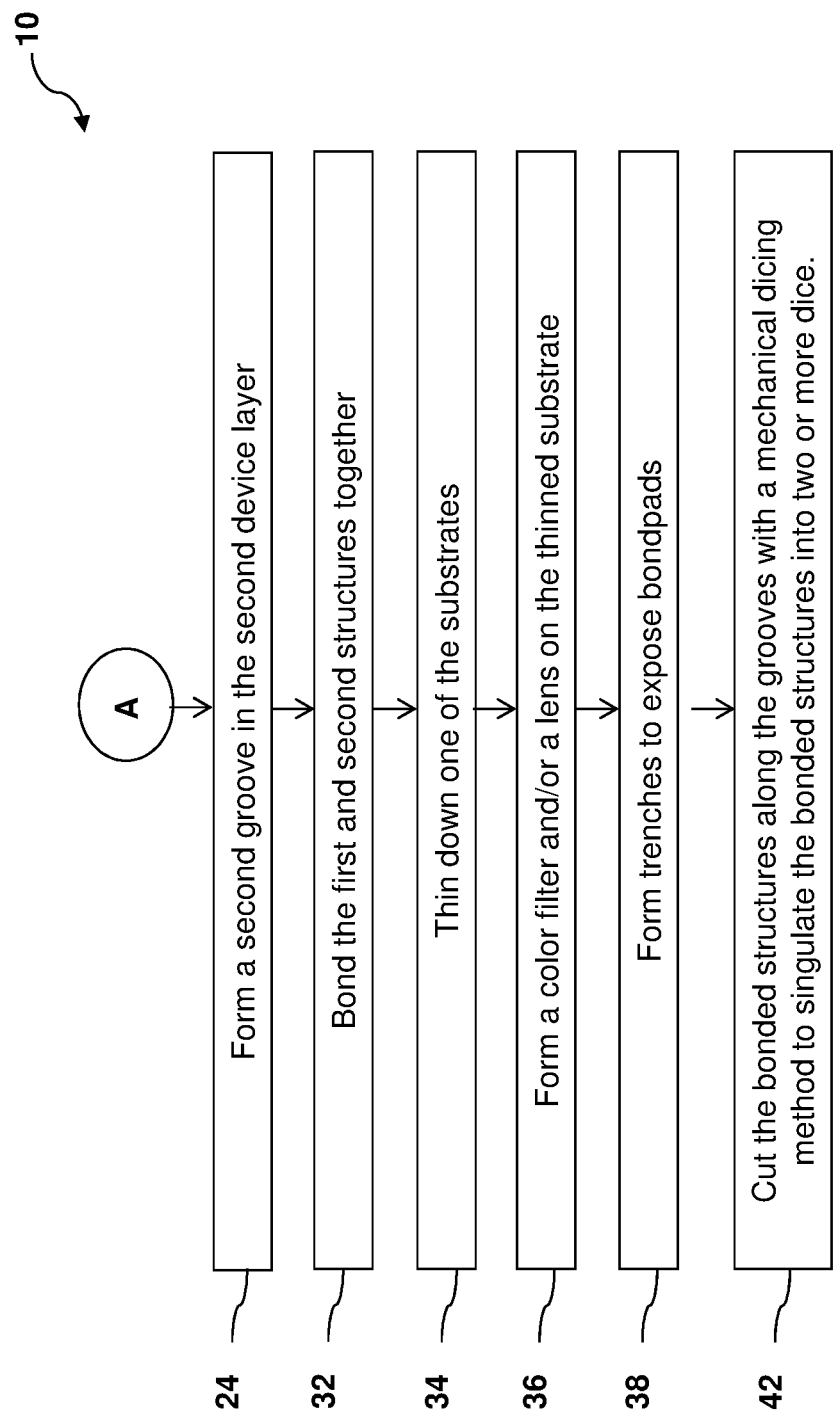

FIGS. 1A, 1B, and 1C illustrate a flow chart of a method 10 for dicing stacked semiconductor devices, such as wafer-on-wafer structures, in accordance with some embodiments. The method 10 is merely an example and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-22. FIGS. 2-22 illustrate various cross-sectional views and associated edge profiles of a stacked semiconductor device during fabrication steps according to the method 10.

Figure 2:
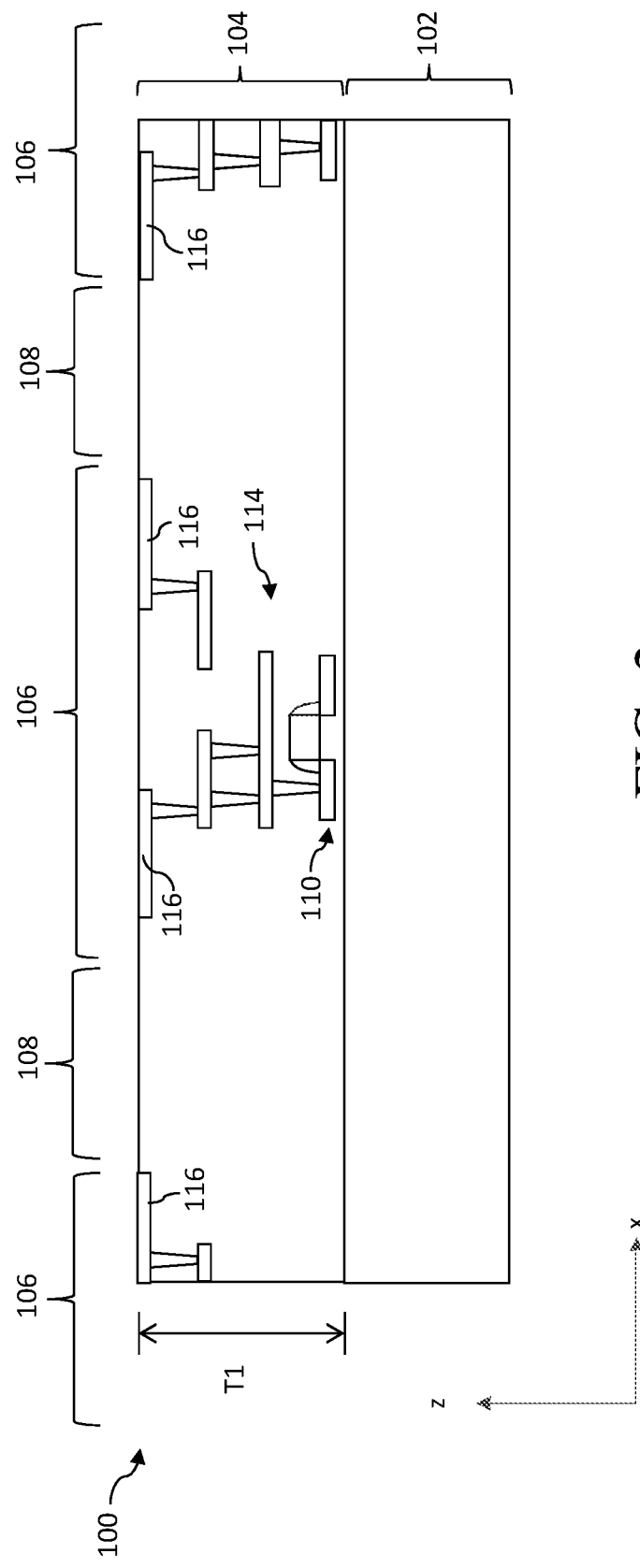
FIGS. 2, 3, 4, 5, 6, 7, 8A, 9, 10, 11, 12, 13, 14, 15, 16, 17, 18, 19, 20, 21, and 22 are cross-sectional views of exemplary devices according to various aspects of the present disclosure.

At operation 12, the method 10 (FIG. 1A) provides, or is provided with, a first device 100 (FIG. 2). In an embodiment, the first device 100 is a wafer, such as a boron doped silicon wafer with a thickness of about 300 μm to about 800 μm and a diameter of about 100, 125, 150, 200 mm or more. The first device 100 includes a substrate 102 and a device layer 104 formed atop the substrate 102. The substrate 102 may be a semiconductor substrate, such as a silicon or ceramic substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Furthermore, the substrate 102 may also be a semiconductor on insulator (SOI).

In some embodiments, the device layer 104 is epitaxially grown and followed by various operations to form, for example, active regions or sensing regions of a semiconductor device. The thickness T1 of the device layer 104 may range from about 1.5 um to about 30 um or thicker. To simplify description, the device layer 104 is shown as a single layer, but in reality, the device layer 104 may include active layers over the substrate 102 where active devices are formed, interconnect metal layers coupling the devices forming functional circuits, and an overlying protective passivation layer. The device layer 104 includes multiple regions, which include a plurality of full chip regions 106 and scribe channel regions 108 that are located between adjacent pairs of full chip regions 106. Each full chip region 106 constitutes a semiconductor IC, which will be subsequently diced along scribe channels in the scribe channel regions 108. In some embodiments, the semiconductor IC is a photo sensing IC, and each full chip region 106 includes a photo sensing region. In furtherance of some embodiments, the semiconductor IC includes logic circuits and each full chip region 106 further includes a transistor region and metallization layers. In some embodiments, the scribe channel regions 108 also include metallization layers (not shown) that electrically coupled to the semiconductor IC, which allows chip defect detections before dicing.

Still referring to FIG. 2, the device layer 104 includes various features disposed therein and/or thereon. For example, the device layer 104 may include various transistors, such as a transistor 110. In various embodiments, the transistor 110 may be a metal-oxide-semiconductor field-effect transistor (MOSFET), such as a CMOS transistor, a fin field-effect transistor (FinFET), a bipolar junction transistors (BJT), a high voltage transistor, a high frequency transistor, a p-channel and/or n-channel field-effect transistor (PFETs/NFET).

The device layer 104 further includes a multilayer interconnect (MLI) 114 coupled to the transistor 110. The MLI 114 includes various conductive features, which may be vertical interconnects, such as contacts and/or vias, and/or horizontal interconnects, such as conductive lines. The various conductive features include conductive materials, such as metal. In an example, metals including aluminum, aluminum/silicon/copper alloy, titanium, titanium nitride, tungsten, polysilicon, metal silicide, or combinations thereof, may be used, and the various conductive features may be referred to as aluminum interconnects. Aluminum interconnects may be formed by a process including physical vapor deposition (PVD), chemical vapor deposition (CVD), or combinations thereof. Other manufacturing techniques to form the various conductive features may include photolithography processing and etching to pattern conductive materials to form the vertical and horizontal connects. Still other manufacturing processes may be implemented to form the MLI 114, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 114 is not limited by the number, material, size, and/or dimension of the conductive features depicted, and thus, the MLI 114 may include any number, material, size, and/or dimension of conductive features depending on design requirements of the device layer 104. In the illustrated embodiment, the MLI 114 further includes metallic pads 116 formed in the uppermost portion of the device layer 104. The lateral dimension of the metallic pads 116 can be on the order of about 10 um to about 200 um.

The various conductive features of the MLI 114 are disposed in an interlayer (or inter-level) dielectric (ILD) layer. The ILD layer may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, BCB (bis-benzocyclobutenes), polyimide, other suitable material, or combinations thereof. The ILD layer may have a multilayer structure. The ILD layer may be formed by a process including spin-on coating, CVD, sputtering, or other suitable process. In an example, the MLI 114 and ILD layer may be formed in an integrated process including a damascene process, such as a dual damascene process or single damascene process.

Figure 3:
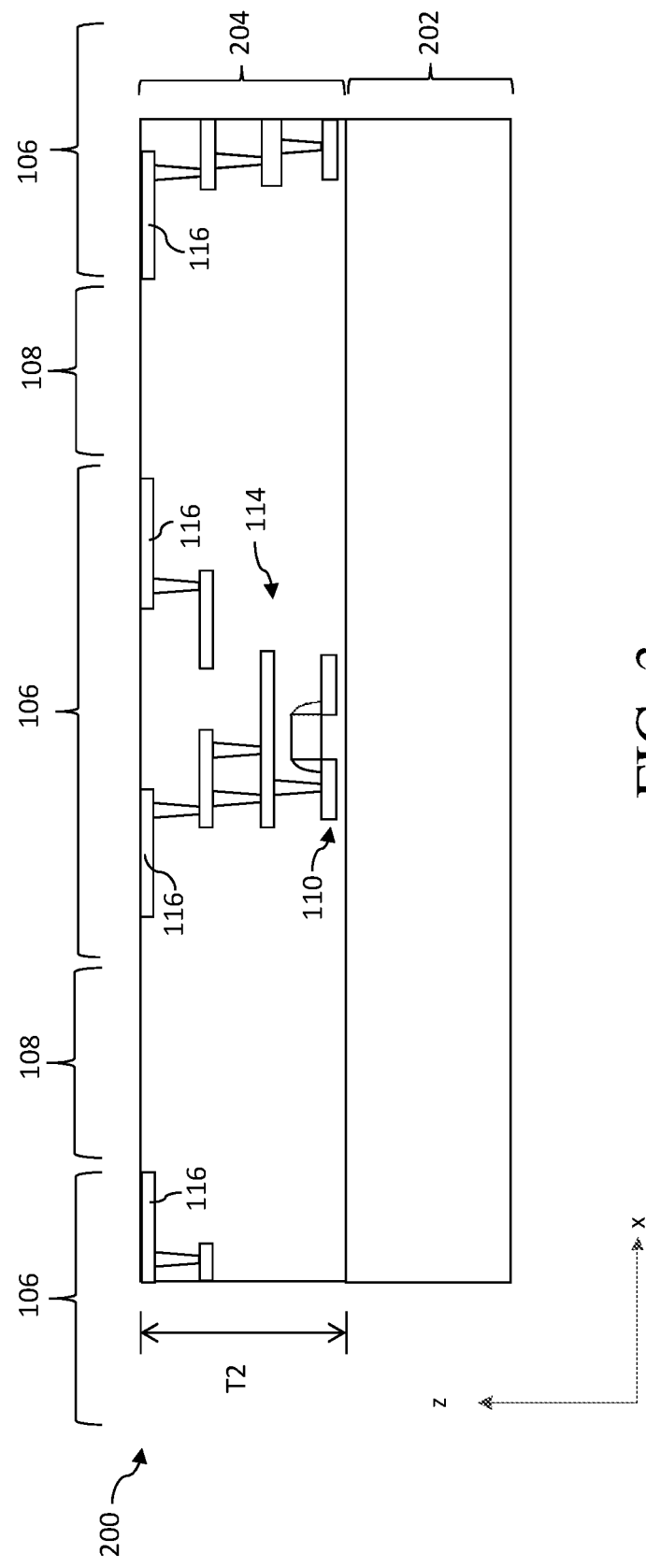

At operation 14, the method 10 (FIG. 1A) provides, or is provided with, a second device 200 (FIG. 3). The second device 200 is separately prepared other than the first device 100. In an embodiment, both the second device 200 and the first device 100 are wafers with the same diameter. The various material compositions, active and passive regions, interconnect metal layers of the second device 200 are similar to what have been discussed above with reference to the first device 100 in FIG. 2 and will be briefly discussed below for the sake of convenience. Reference numerals are repeated for ease of understanding. The second device 200 includes a substrate 202 and a device layer 204 formed atop the substrate 202. The substrate 202 may be a semiconductor substrate, including silicon or other suitable semiconductor materials. The thickness T2 of the device layer 204 may range from about 1.5 um to about 30 um or thicker. The device layer 204 includes multiple regions, which include a plurality of full chip regions 106 and scribe channel regions 108 that are located between adjacent pairs of full chip regions 106. Each full chip region 106 constitutes a semiconductor IC, which will be subsequently diced along scribe channels in the scribe channel regions 108. The full chip region 106 may include a transistor region and metallization layers, such as MLI 114, to route signals from transistors 110 externally through metallic pads 116.

Figure 4:
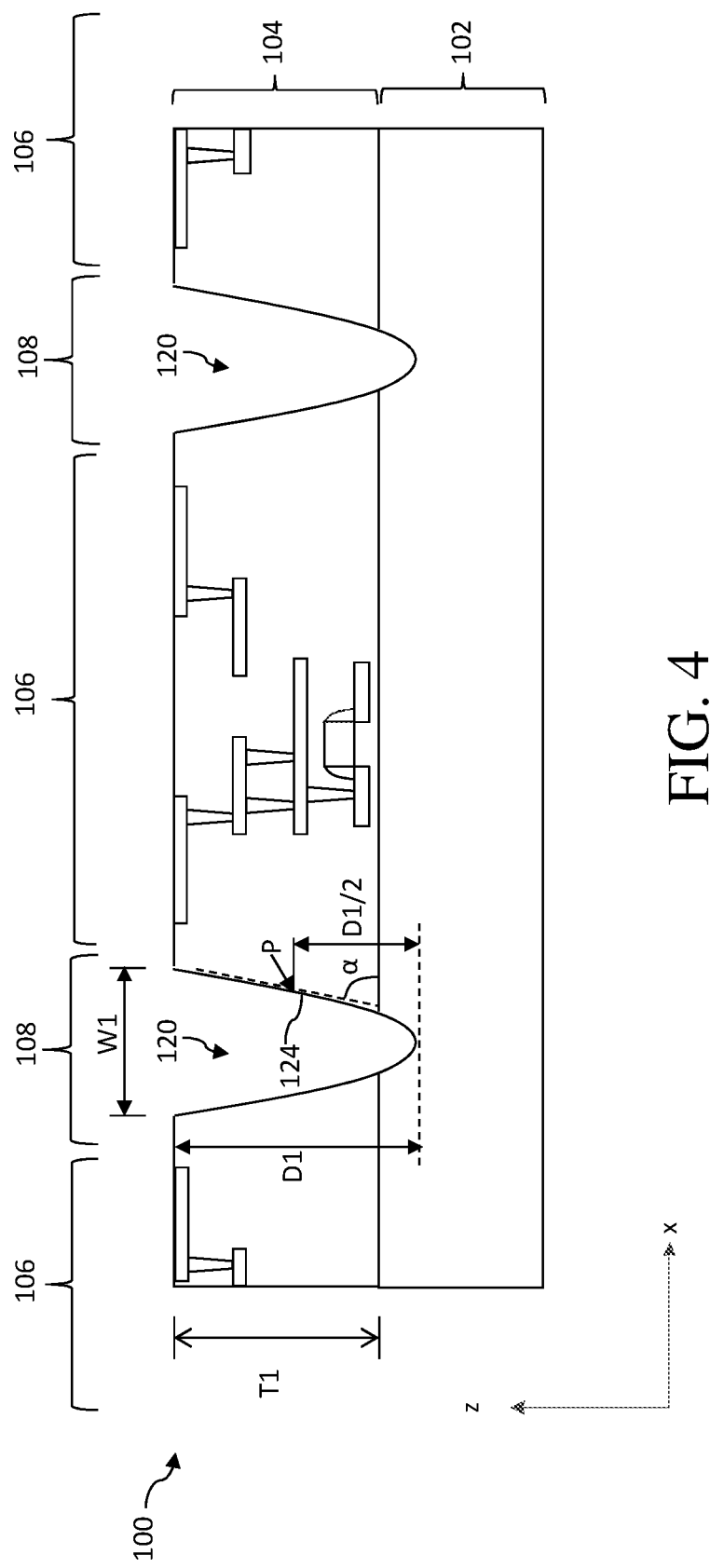

At operation 16, the method 10 (FIG. 1A) forms grooves 120 through the device layer 104 of the first device 100 and optionally into an upper portion of the substrate 102 (FIG. 4). The grooves 120 are formed along scribing channel regions 108 that correspond to lateral boundaries between adjacent pairs of semiconductor chips. In some embodiments, operation 16 employs a laser beam or pulses to form the grooves, which is also termed a laser grooving process. In various embodiments, the laser is a solid-state laser, a yttrium-aluminum-garnet (YAG) laser, a neodymium-YAG laser, or other appropriate laser. Alternatively, the grooving process may use other suitable non-mechanical cutting methods other than laser, such as a plasma cutting process. The grooves 120 are formed through the device layer 104 by removing center portions, or all, of the scribe channel regions 108 selective to the full chip regions 106. In other words, the scribe channel regions 108 provide enough width for the grooves 120 to form without removing portions of the full chip regions 106. An opening width W1 of a groove 120 may range from about 5 um to about 100 um or wider. In some embodiments, the opening width W1 is about 1.5 to about 10 times of the thickness T1 of the device layer 104. In a specific embodiment, the groove 120 has an opening width W1 about 55 um and a depth D1 about 15 um. The bottom of the groove 120 may stop at the top surface of the substrate 102 or optionally extend slightly into the substrate 102. Accordingly, the depth D1 may constitute two parts, the first part being the thickness T1 of the device layer 104 and the second part being the depth of a bottom portion of the groove 120 that extends into the substrate 102, where a ratio of the first part (T1) to the second part (D1−T1) may range from about 5:1 to about 20:1, such as about 8:1. If T1/(D1−T1) is larger than about 20:1, it means the bottom portion of the groove 120 extending into the substrate 102 may be shallow, such that mechanical errors may cause some other grooves not extending fully through the device layer 104. If T1/(D1−T1) is smaller than about 5:1, it means the bottom portion of the groove 120 may extend into the substrate 102 too deep, such that laser irradiation may have created too much silicon debris. The laser grooves through the device layer 104 avoids damages to this layer by mechanical and thermal stress of a blade saw in subsequent dicing operations. The laser grooves are also substantially limited to the device layer 104, which avoids silicon debris contamination caused by laser irradiating into the substrate 102.

After forming the grooves 120, the edge of the to-be-diced semiconductor IC (i.e., the full chip region 106) comprises a tapered sidewall 124. The tapered sidewall essentially includes one-half of a laser grooving profile (minus about a cutting width of a mechanical dicing to be discussed later on). The tapered sidewall 124 extends from a top surface of the device layer 104 to or optionally below a top surface of the substrate 102. The tapered sidewall 124 may have a rounded or a pointed bottom. Slope at different locations of the tapered sidewall 124 may vary. A benchmark is to measure slope at a point P at half of the groove depth (D1/2), as shown in FIG. 4. The slope is defined as a tangent of an angle α formed between the top surface of the substrate 102 and a tangential line of the tapered sidewall 124 through point P. In some embodiments, the angle α ranges from about 35° to about 80°, such as about 45°. The angle α as referred to as the angle formed by the respective sidewall. A surface roughness (measured in RMS) of the tapered sidewall 124 is denoted as R1. In a specific example, R1 may range from about 20 nm to about 100 nm. As will be illustrated below, the surface roughness of a laser grooving profile is often larger than that of a mechanical dicing profile, such as about at least five times in some embodiments.

Figure 5:
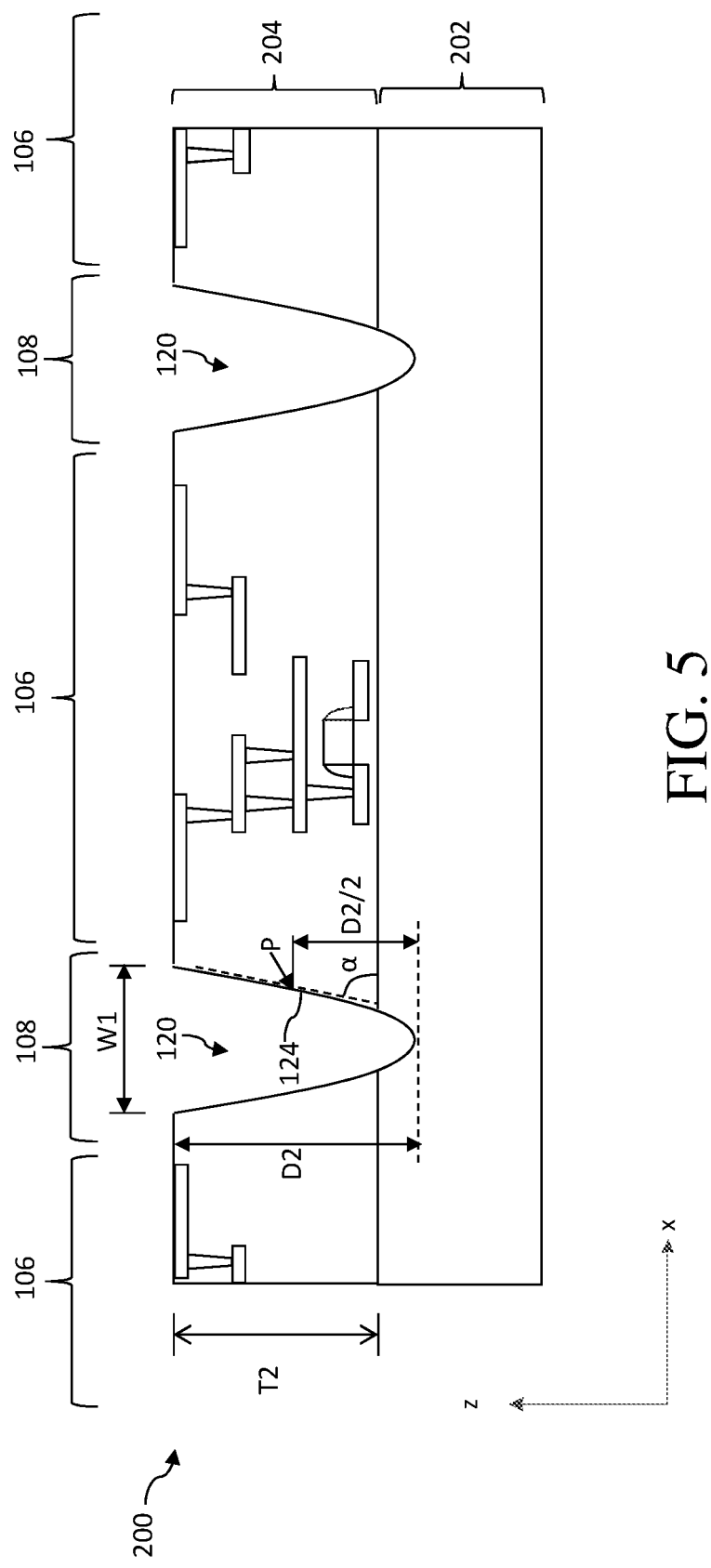

At operation 24, the method 10 (FIG. 1A) forms grooves 120 through the device layer 204 of the second device 200 and optionally into an upper portion of the substrate 202 (FIG. 5). The aspect of operation 24 are substantially similar to operation 16 as discussed above with reference to FIG. 4. Reference numerals are repeated in FIG. 5 for ease of understanding. Similarly, a depth D2 of the grooves 120 in the device layer 204 may equal to or slightly larger than the thickness T2 of the device layer 204. The angle α of the tapered sidewall 124 at half of the depth D2 ranges from about 35° to about 80°, such as about 45°. If the angle α is smaller than 35°, opening width W1 may be wider than what a scribe channel region 108 can provide. If the angle α is larger than 80°, the opening width W1 may be too narrow for mechanical dicing tools, which will be discussed below, to go through without touching the tapered sidewalls 124.

Figure 6:
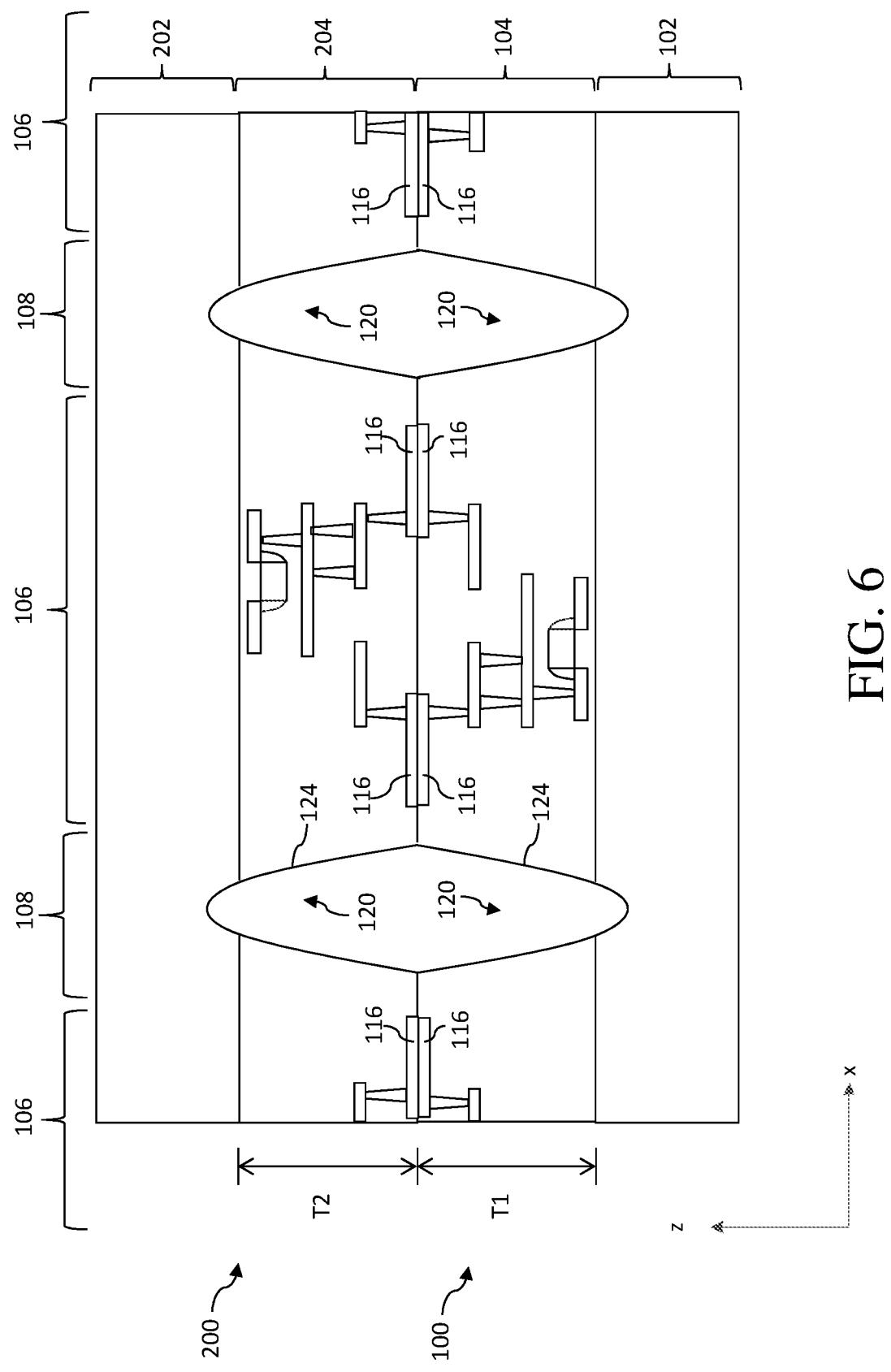

At operation 32, the method 10 (FIG. 1A) physically joins the first device 100 to the second device 200 to form a stacked semiconductor device by a bonding process. One embodiment of the bonding process is illustrated in FIG. 6. In the illustrated embodiment, the device 200 is flipped over and the device layer 204 directly faces the device layer 104 of the device 100. In an embodiment the bonding process is a thermal compression bonding process, whereby the device 100 and the device 200 are placed between two hot plates (not shown), and heat and force are applied to physically bond the two devices. In such a technique, the two devices are heated to a temperature greater than about 150 ° C., such as about 350 ° C., while a pressure of between about 1 Mpa and about 100 Mpa, such as about 20 Mpa, is applied. In the illustrated embodiment, the grooves 120 of the first device 100 (lower grooves) is directly under the grooves 120 of the second device 200 (upper grooves). Misalignment may cause center positions of the upper and lower grooves to shift laterally. As long as a portion of the lower groove is directly under a portion of the upper groove, the spatial relationship of the two grooves is still termed as "directly under." After bonding, a pair of upper and lower grooves joins and forms a larger void extending continuously from the upper groove to the lower groove.

Alternatively, in an embodiment of the bonding process, the device layer 104 of the first device 100 and the device layer 204 of the second device 200 are aligned and bonded together through metallic pads 116. The bonded metallic pads 116 provide signal paths from the first device layer 104 to the second device layer 204. In an embodiment, a bonding medium, such as copper, tungsten, a copper-tin alloy, a gold-tin alloy, an indium-gold alloy, a lead-tin alloy, or the like, is applied between the bonding contacts on the to-be-bonded metallic pads 116. In furtherance of the embodiment, the bonding process may be a reflow process. In such a process, solder is applied at locations of the metallic pads 116, then the devices 100 and 200 are placed between two hot plates and the temperature is raised to a suitable temperature such that the solder will reflow. This reflow will bond the external conductors together. In yet another example, the bonding process may be a near infrared (NIR) reflow process. In such a process, near infrared radiation may be directed instead of direct heating to cause solder to reflow and bond the external conductors. Besides thermal compression bonding, a reflow process, an NIR reflow process, or any other suitable bonding process may alternatively be utilized.

Figure 7:
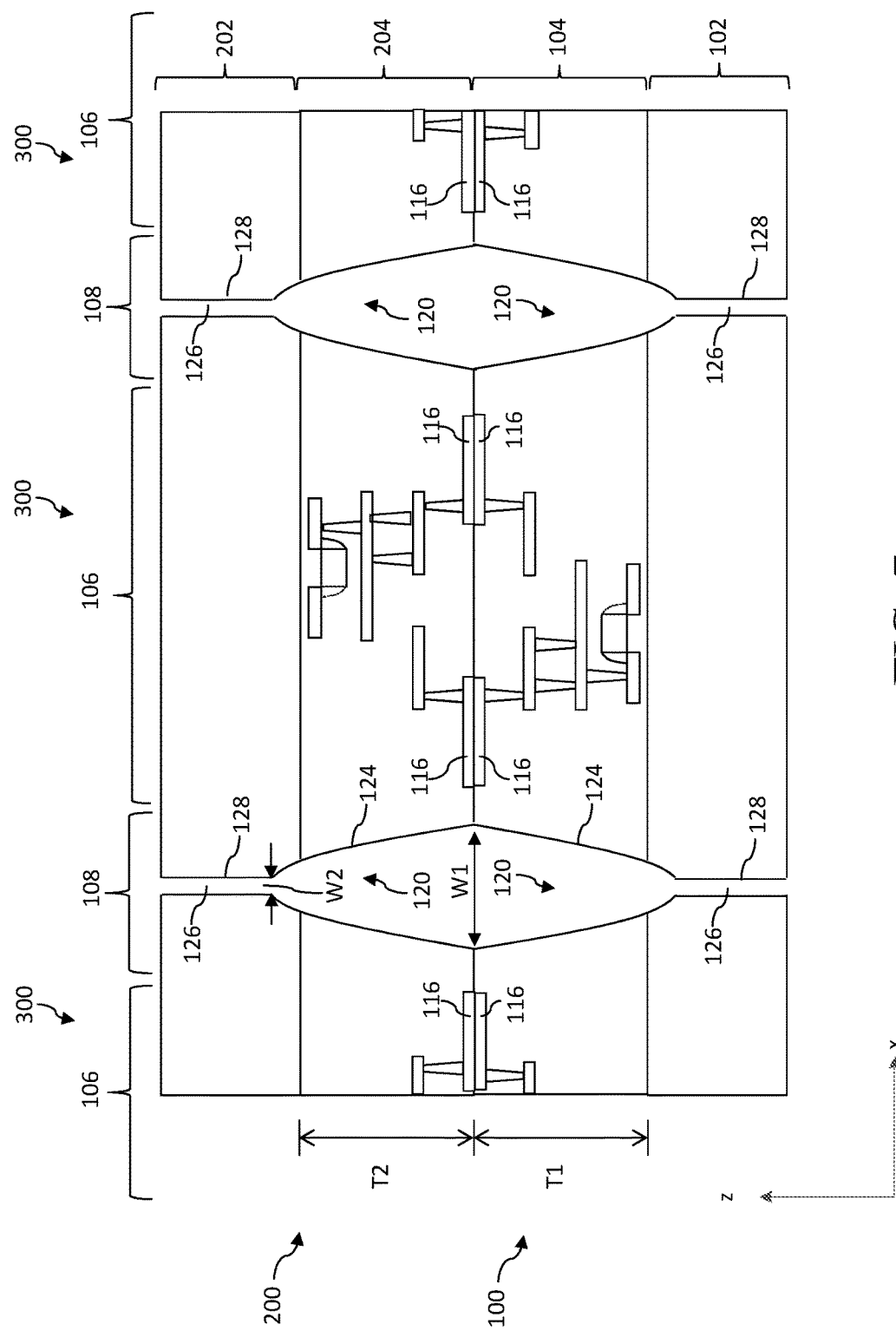
Figure 8:
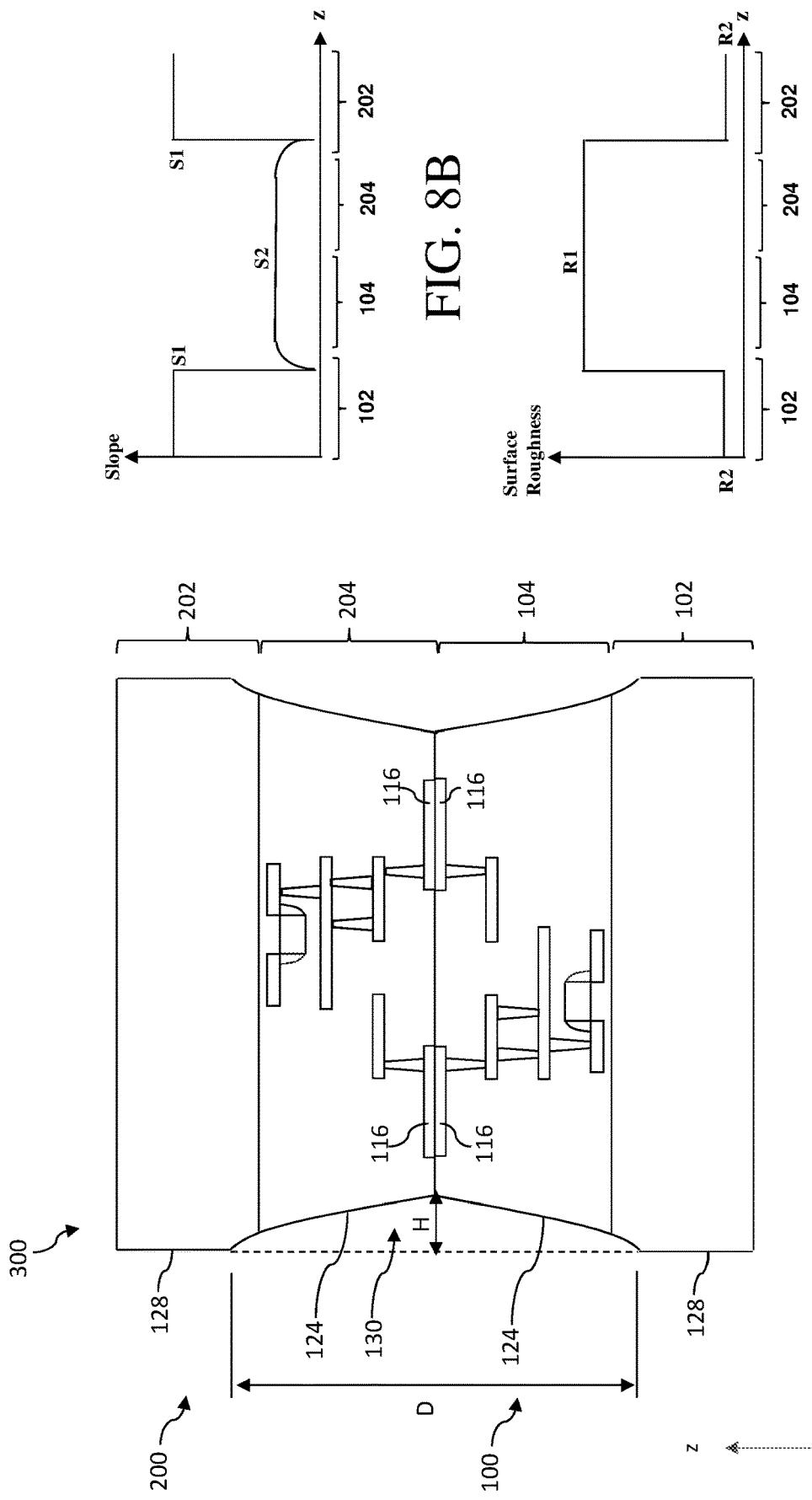
FIGS. 8B and 8C shows characteristics of slopes and surface roughness of an edge of an exemplary stacked semiconductor device in FIG. 8A according to various aspects of the present disclosure.

At operation 42, the method 10 (FIG. 1A) cuts along the scribe channel region 108 with a cutting technique other than laser, such as mechanical dicing, to divide the bonded semiconductor structure into two or more dice 300 (FIG. 7). In some embodiments, the mechanical dicing employs a saw or a blade (not shown) to cut through the substrate 202, upper groove 120, lower groove 120, and substrate 102 in sequence. In some alternative embodiments, the saw or blade does not completely cut through the substrate 102, but followed by a mechanical cleaving process to crack the bonded semiconductor device into dice. The saw or blade may be attached to a housing that holds a motor driving a rotor to which the saw or blade is fixed. In a particular example, the mechanical dicing employs a circular blade that has a nickel-diamond cutting surface.

During mechanical dicing and prior to dice 300 are completely physically separated, the mechanical dicing process forms a dicing cut 126 with a width W2 measured at its opening to the groove 120 that is smaller than the width W1 of the opening of the groove 120. In some embodiments, the width W1 is about two times to about twenty times of the width W2, such as about five times. In various embodiments, mechanical dicing forms a straight cut, such that sidewalls 128 of the dicing cut 126 are substantially vertical. Here, "substantially vertical" is referred to an angle formed between a sidewall 128 and a top surface of the corresponding substrate being larger than 80°.

Since the mechanical dicing goes through the grooves 120 and does not have substantial physical contacts with the device layers 104 and 204, the thermal and mechanical stress during dicing is mainly restricted in the substrates 102 and 202, which mitigates damages to the device layers 104 and 204. For example, silicon peeling, if any, is unlikely to propagate into the device layers 104 and 204, which reduces device defect rate.

Referring to FIG. 8A, a diced semiconductor IC 300, after a hybrid dicing process combining laser grooving and mechanical dicing, is illustrated. Specifically, the semiconductor IC 300 includes the substrate 102 and device layer 104 (including transistors and metal layers in the full chip region) of the first device 100 and the device layer 204 (including transistors and metal layers in the full chip region) and substrate 202 of the second device 200. The circuits in the device layers 104 and 204 may electrically couple to each other through bonded metallic pads 116. The edge of the semiconductor IC 300 comprises an upper sidewall 128 that is substantially vertical, an upper tapered sidewall 124, a lower tapered sidewall 124, and a lower sidewall 128 that is substantially vertical. In the illustrated embodiment, the sidewalls 124 and 128 form a continuous sidewall profile. Each of the upper and lower sidewalls 128 essentially includes one-half of a mechanical dicing cut profile. Each of the upper and lower tapered sidewalls 124 essentially includes one-half of a laser grooving profile (minus about one-half of a mechanical dicing cutting width). The upper and lower tapered sidewalls 124 form a concave 130 bended towards a center of the semiconductor chip 300. A width D of the concave 130 is defined as a length from an intersecting point of the upper sidewall 128 and upper tapered sidewall 124 to another intersecting point of the lower sidewall 128 and lower tapered sidewall 124. A height H of the concave 130 is defined as a lateral distance from an edge point at the interface of the device layers 104 and 204 to either of the intersecting points defined above. The width D of the concave 130 is equal to or slightly larger than a sum of the thicknesses of the device layers 104 and 204. In some embodiments, the width D ranges from about 3 um to about 80 um. The height H of the concave is roughly one-half of the groove width W1 minus one-half of the mechanical dicing cut width W2 ((W1−W2)/2). In some embodiments, the height H ranges from 1 um to about 50 um. In some embodiments, a ratio of H/D ranges from about 0.01 to about 20. In a specific embodiment, the concave 130 has a width D about 30 um and a height H about 28 um.

FIGS. 8B and 8C shows characteristics of the edge of the semiconductor IC 300. Specifically, in FIG. 8B, the vertical axis represents the slope of the edge and the horizontal axis z represents a distance along the vertical direction from a bottom surface of the substrate 102; in FIG. 8C the vertical axis represents the surface roughness of the edge and the horizontal axis z represents a distance along the vertical direction from a bottom surface of the substrate 102. Referring to FIG. 8B, due to the substantially vertical sidewall 128, slopes in substrates 102 and 202 has a maximum value S1. The slope profile, according to some embodiments, has a turning point at or near interfaces between a device layer and a substrate. The slop is substantially flat within substrates 102 and 202, drops to near zero at the interfaces, and then increases to a value S2, in which S2 is smaller than S1. In some embodiments, S1 corresponds to a tangent of an angle larger than 80°, while S2 corresponds to a tangent of an angle between about 35° and about 80°, such as about 45°. Referring to FIG. 8C, in some embodiments, a surface roughness R1 (measured in RMS) of the tapered sidewalls 124 (covering edges of both device layers 104 and 204 and optionally slightly into substrates 102 and 202) is larger than that of a mechanical dicing profile. In other words, sidewalls 128 due to mechanical dicing are often smoother than those due to laser grooving. In some embodiments, a surface roughness R2 (measured in RMS) of the sidewalls 128 (covering most or entire edges of substrates 102 and 202) is less than about one fifth of R1.

Figure 9:
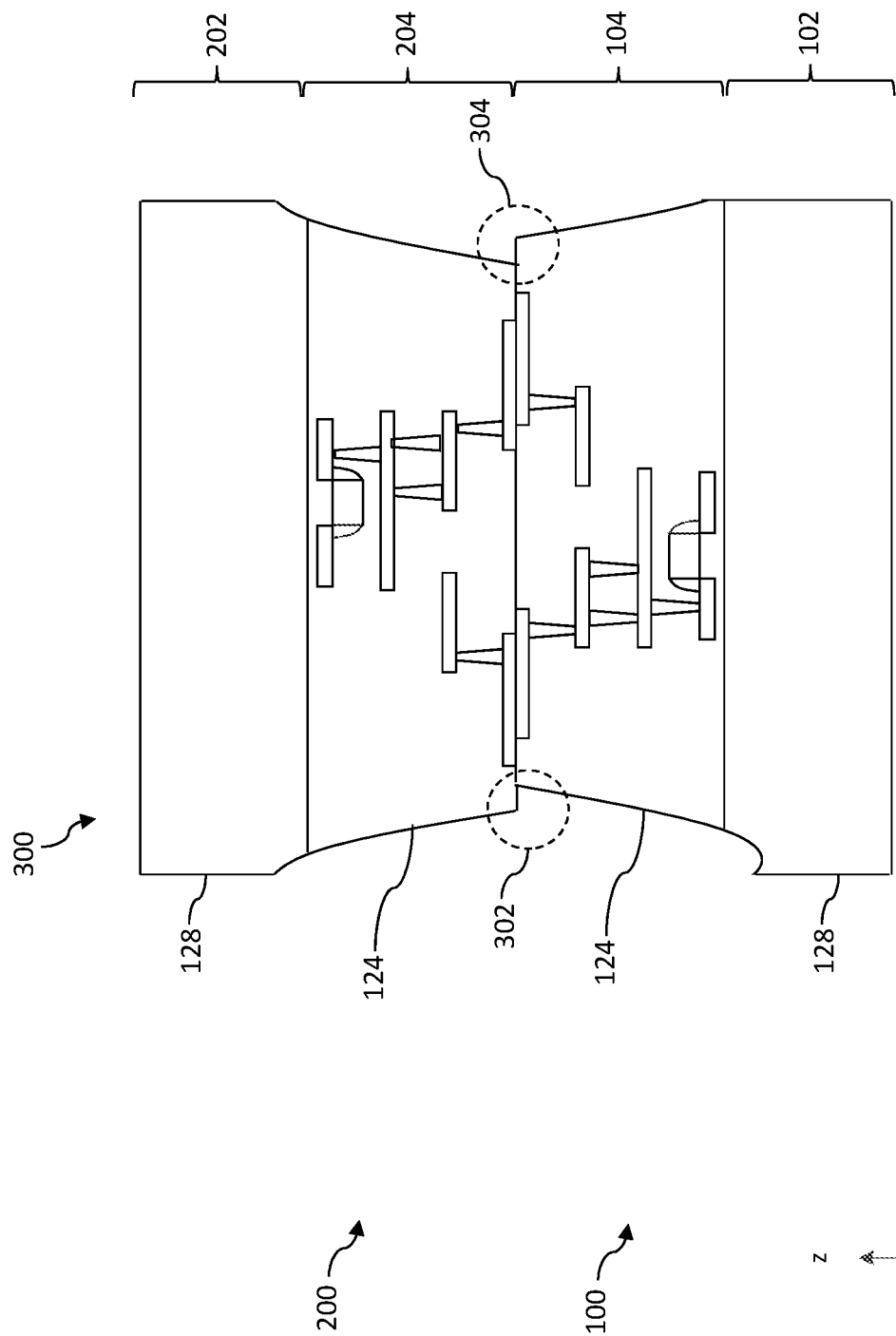

In some occasions, misalignment during bonding may cause lateral shifting between the first device 100 and the second device 200. As shown in FIG. 9, tapered sidewalls 124 of the pairs of grooves may be discontinued due to the lateral shifting and form a step profile. In region 302 at one edge of the interface between device layers 104 and 204, a surface of the device layer 204 facing downwardly is exposed. In region 304 at another edge of the interface between device layers 104 and 204, a surface of the device layer 104 facing upwardly is exposed. Depends on the distance of lateral shifting, either surface of the device layers 104 and 204 may be exposed for about 0.1 um to about 20 um, in some embodiments.

Figure 10:
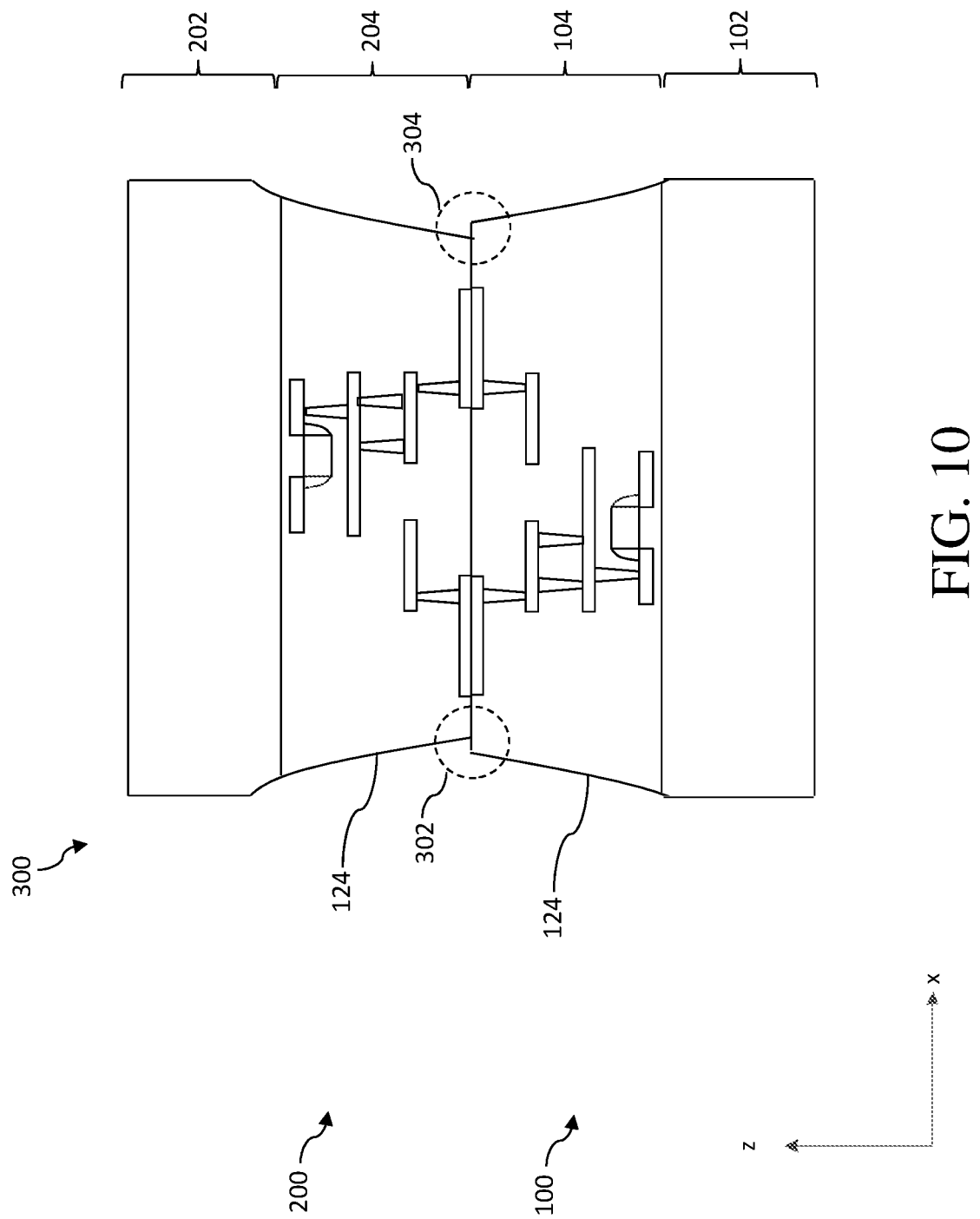

In some occasions, grooves in a pair may have different opening width, also causing step profiles at edges of the diced semiconductor IC 300. In FIG. 10, the lower groove in the device layer 104 before dicing has a smaller opening than the upper groove in the device layer 204. As a result, in both regions 302 and 304, top surfaces of the device layer 104 are exposed and the tapered sidewalls 124 are discontinued and form a step profile. The different groove opening widths may be caused by different laser strengths during grooving or due to different device layer thicknesses, as usually thinner the device layer, shallower and narrower a groove would be. On either edge of the semiconductor IC 300, top surface of the device layer 104 may be exposed for about 0.1 um to about 20 um.

Figure 11:
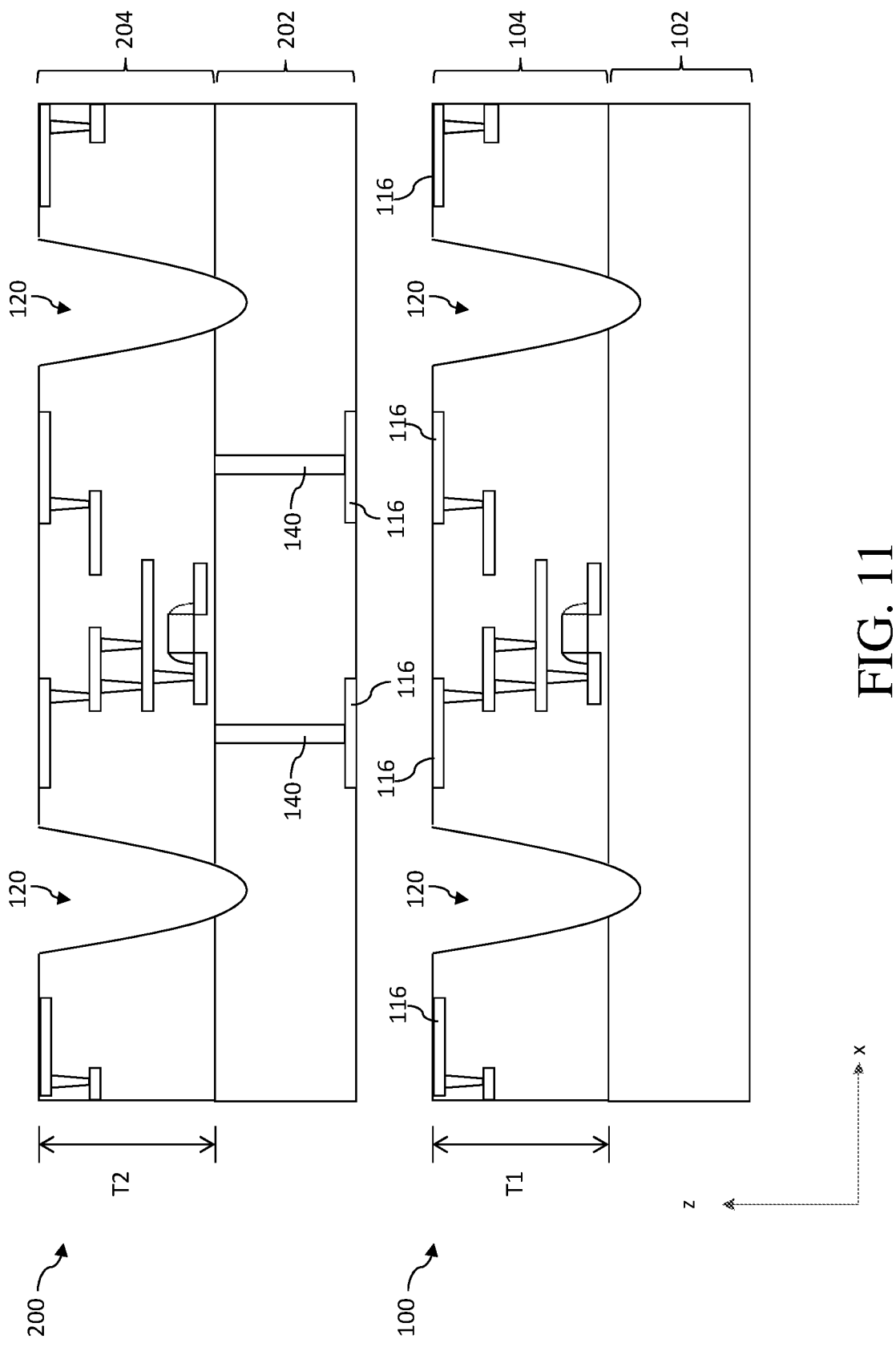

Referring back to operation 32 of the method 10 (FIG. 1A), yet an alternative embodiment of the bonding process is to bond a substrate of one device to a device layer of another device without flipping over one or the other. As illustrated in FIG. 11, before bonding, a bottom surface of the substrate 202 of the second device 200 directly faces a top surface of the device layer 104 of the first device 100. A groove 120 in the device 100 is directly under the corresponding groove 120 in the device 200 but separated by a substrate 202 in between. Before bonding, the second device 200 may further have through-silicon via (TSV) 140 formed in the substrate 202 to route circuit signals in the device layer 204 to a bottom surface of the substrate 202. TSV 140 may be formed by etching a vertical hole through the substrate 202 and filling the hole with a conductive material, such as copper. Metallic pads 116 may also be formed at the bottommost portion of the substrate 202 by suitable methods, such as single damascene process or dual damascene process. Bonding process may be substantially similar to what has been discussed above in association with FIG. 6. Thermal compression bonding, a reflow process, or an NIR reflow process, or other suitable bonding process may be utilized to physically join the first and second devices. After the bonding, circuits in the device layer 204 electrically couples to the circuits in the device layer 104 through TSVs 140 and bonded metallic pads 116.

Figure 12:
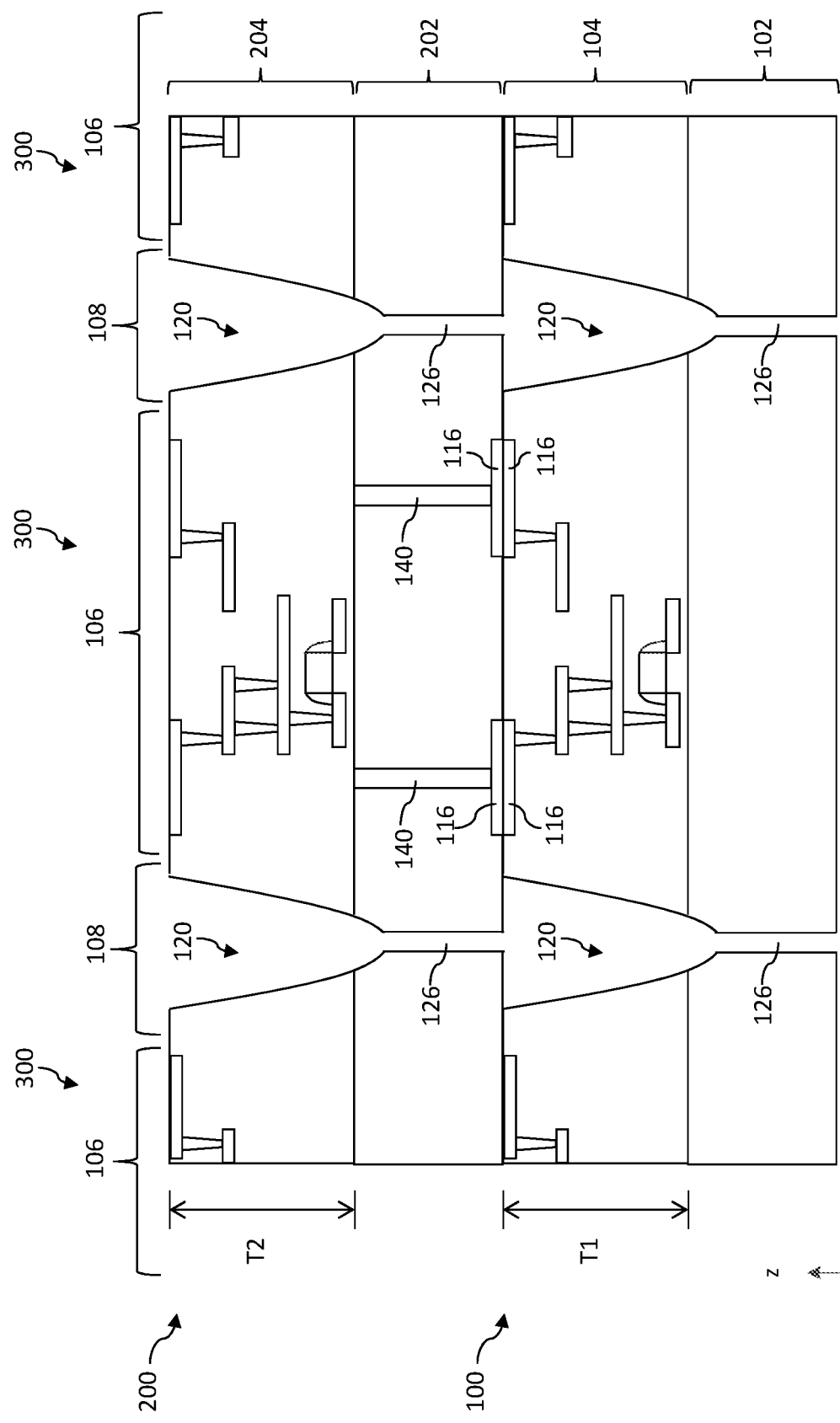

Referring back to operation 42, the method 10 (FIG. 1A) cuts along the scribe channel region 108 with a cutting technique other than laser, such as a mechanical dicing method, to divide the bonded semiconductor structure into two or more dice 300 (FIG. 12). In various embodiments the mechanical dicing is substantially similar to what has been discussed above in association with FIG. 7. One of the differences is that a saw or a blade employed in the mechanical dicing cuts through the upper groove 120, the substrate 202, the lower groove 120, and substrate 102 in sequence. The dicing cut 126 in the substrate 202 connects the upper and lower grooves 120.

Figure 13:
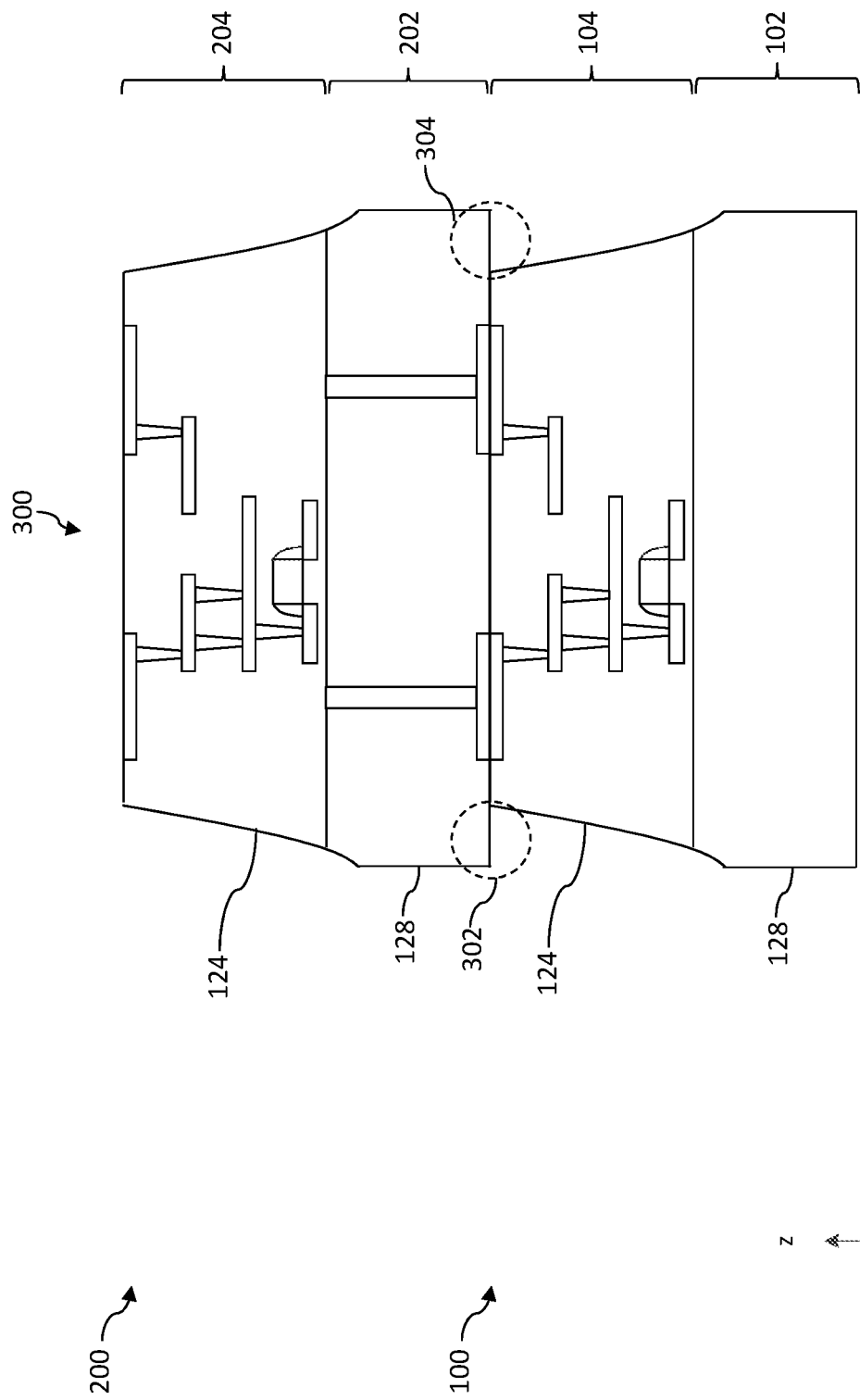

A diced semiconductor IC 300 from the alternative embodiment of bonding, after a hybrid dicing process that combines laser grooving and mechanical dicing, is illustrated in FIG. 13. The edge of the semiconductor IC 300 comprises five segments, namely an upper tapered sidewall 124, an upper sidewall 128 from the mechanical dicing through the substrate 202, a bottom surface of the substrate 202, a lower tapered sidewall 124, and a lower sidewall 128 from the mechanical dicing through the substrate 102, in sequence. Sidewalls 128 due to mechanical dicing are often smoother than tapered sidewalls 124 due to laser grooving. In various embodiments, a surface roughness (measured in RMS) of the tapered sidewalls 124 is at least five times of a surface roughness of the sidewalls 128. With a reference to a bottom surface of the semiconductor IC 300, sidewalls 128 form an angle larger than 80°, and tapered sidewalls 124 form an angle between about 35° and about 80°, such as about 45°, in some embodiments.

Figure 14:
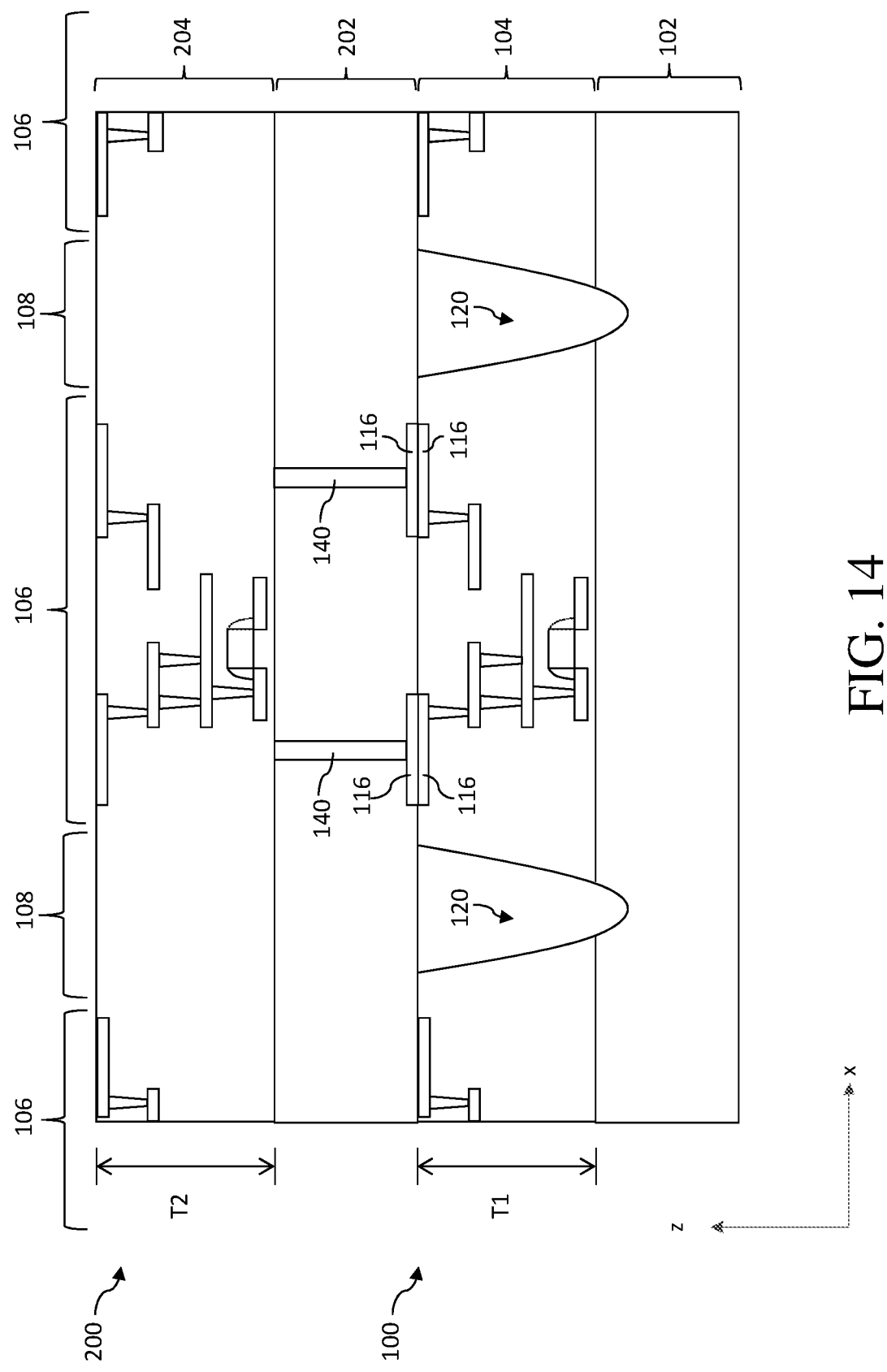

Referring to FIG. 1B, in some other embodiments of method 10, operation 32 of bonding the first and second devices together can be prior to operation 24 of forming grooves in the second device layer. As shown in FIG. 14, grooves 120 are formed in the scribe channel regions 108 of the first device 100, but not in the second device 200. Thermal compression bonding, a reflow process, an NIR reflow process, or other suitable bonding process may be utilized to physically join the first and second devices. After the bonding, the substrate 202 of the second device 200 covers the grooves 120 in the device layer 104 of the first device 100. TSVs 140 and metallic pads 116 provide signal paths for electrically connecting the circuits in the devices layers 104 and 204.

Figure 15:
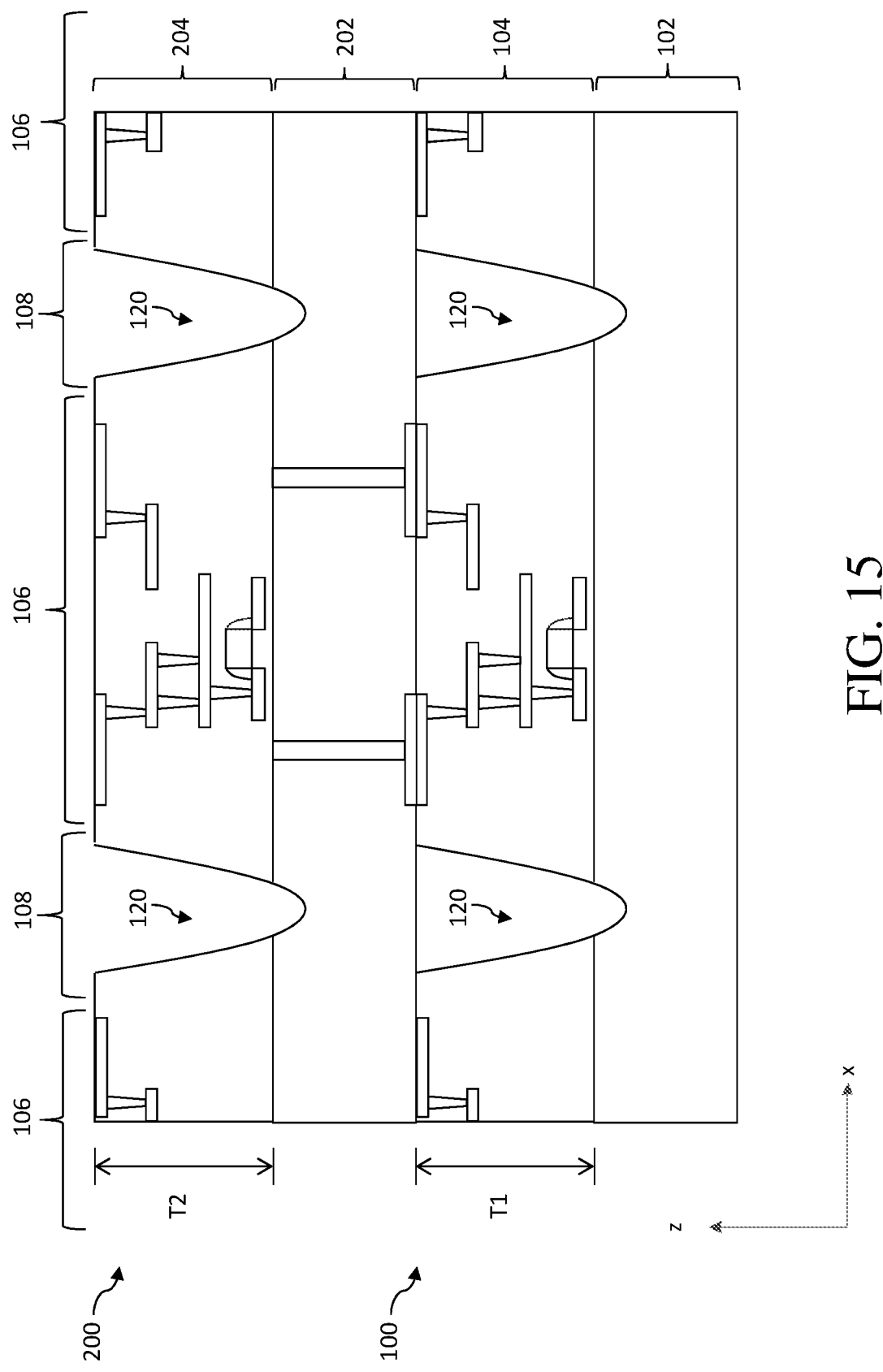

At operation 24, after the bonding, the method 10 (FIG. 1B) forms grooves 120 through the device layer 204 of the second device 200 and optionally into an upper portion of the substrate 202 (FIG. 15). The grooving process is substantially similar to those discussed above in association with FIG. 5. The grooves 120 in the device layer 204 are directly above corresponding grooves 120 in the device layer 104.

Figure 16:
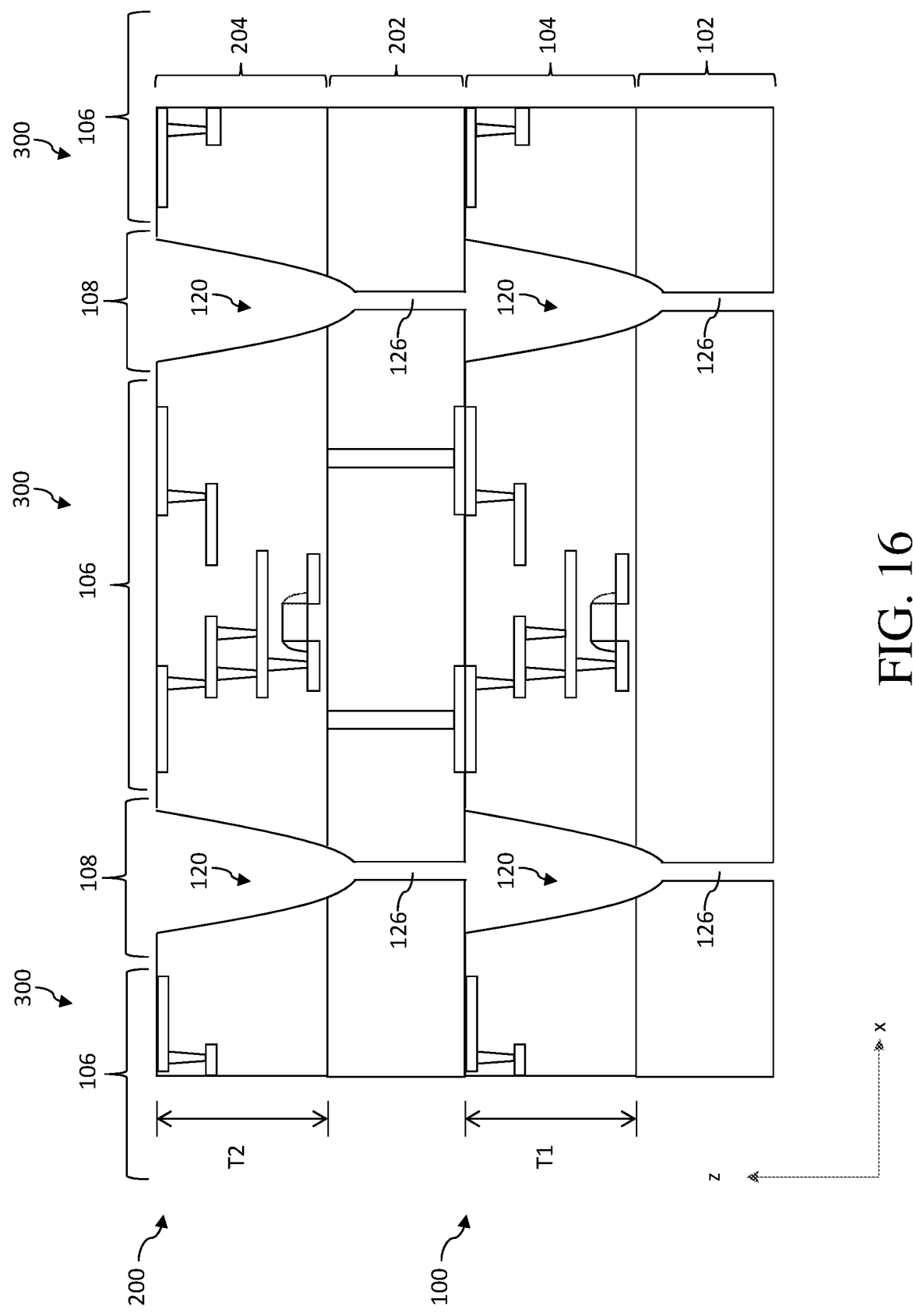

Subsequently, at operation 42, the method 10 (FIG. 1B) cuts along the scribe channel region 108 with a cutting technique other than laser, such as a mechanical dicing method, to singulate the bonded semiconductor structure into two or more dice 300 (FIG. 16). In some embodiments, the mechanical dicing employs a saw or a blade (not shown) to cut through the upper groove 120, the substrate 202, the lower groove 120, and substrate 102 in sequence. The dicing cut 126 in the substrate 202 connects the upper and lower grooves 120. The mechanical dicing is substantially similar to what has been discussed above in association with FIG. 12.

Figure 17:
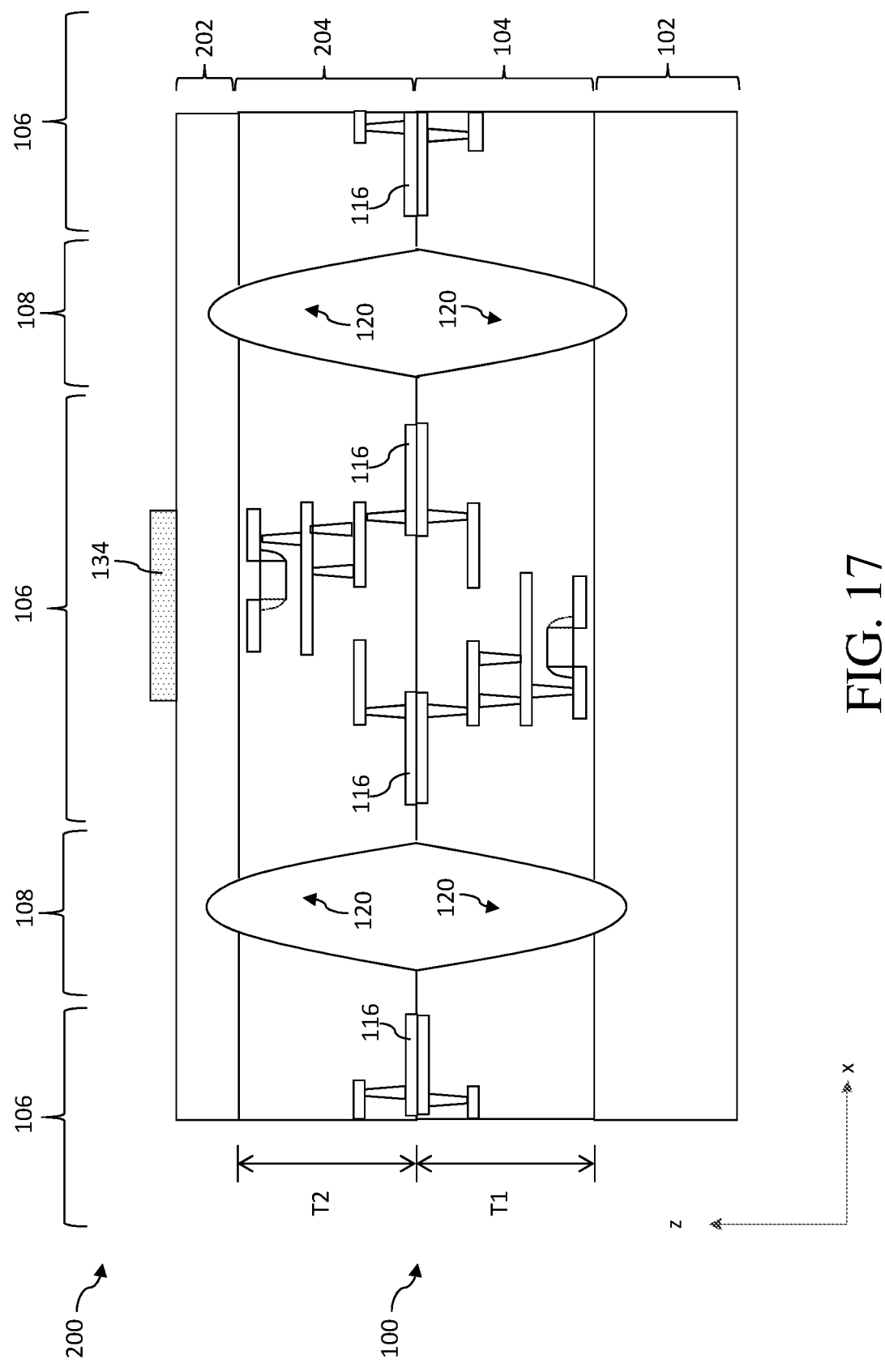

Referring to FIG. 1C, method 10 may optionally include other operations. In some embodiments, after operation 32 of bonding first and second devices 100 and 200, the method 10 proceeds to operation 34 to a substrate thickness reduction process (FIG. 17). A substrate thickness reduction process (also referred to as a thinning process) is performed to reduce a thickness of one of the substrates or both. In the illustrated embodiment, the substrate 202 of the second device 200 is thinned down. For example, from about a thickness about 700 μm to a thickens about 5 μm. In some embodiments, a coarse grinding and a fine grinding are applied to the backside of the substrate 202. In the coarse grinding step, a substantial portion, but not the entire thickness of the substrate 202 is removed. The amount of material removed in this coarse grinding step is determined, in part, by the total roughness of the silicon surface after the coarse grinding and the additional process steps which will be required to eliminate the roughness and damage created during the coarse grinding step. The average roughness for a coarse ground surface may be determined using a profilometer with the average roughness, being measured over a one square-centimeter area. To remove the roughness and damage created in the coarse grinding step, the surface of the substrate 202 is subjected to a second grinding step, i.e., the fine grinding step. For fine grinding, a mesh finish grinding wheel may be used.

At operation 36, method 10 (FIG. 1C) forms a color filter and/or a lens on the thinned substrate (FIG. 17). In the illustrated embodiment, a color filter 134 is disposed over the backside of the thinned substrate 202 and is aligned with a light-sensing region inside the full chip region 106. The color filter 134 is designed so that it filters through certain light of a predetermined wavelength. For example, the color filter 134 may filter through visible light of a red wavelength, a green wavelength, or a blue wavelength to the sensing region. The color filter 134 includes any suitable material. In an example, the color filter 134 includes a dye-based (or pigment-based) polymer for filtering out a specific frequency band (for example, a desired wavelength of light). Alternatively, the color filter 134 includes a resin or other organic-based material having color pigments. A lens (not shown) may be disposed over the backside of the substrate 202, particularly over the color filter 134, and is also aligned with the light-sensing region. The lens may be in various positional arrangements with the sensing region and color filter 134, such that the lens focuses the incident radiation on the sensing region. The lens includes a suitable material and may have a variety of shapes and sizes depending on an index of refraction of the material used for the lens and/or a distance between the lens and sensing region. Alternatively, the position of the color filter 134 and lens layer may be reversed, such that the lens is disposed between the thinned substrate 202 and the color filter 134.

Figure 18:
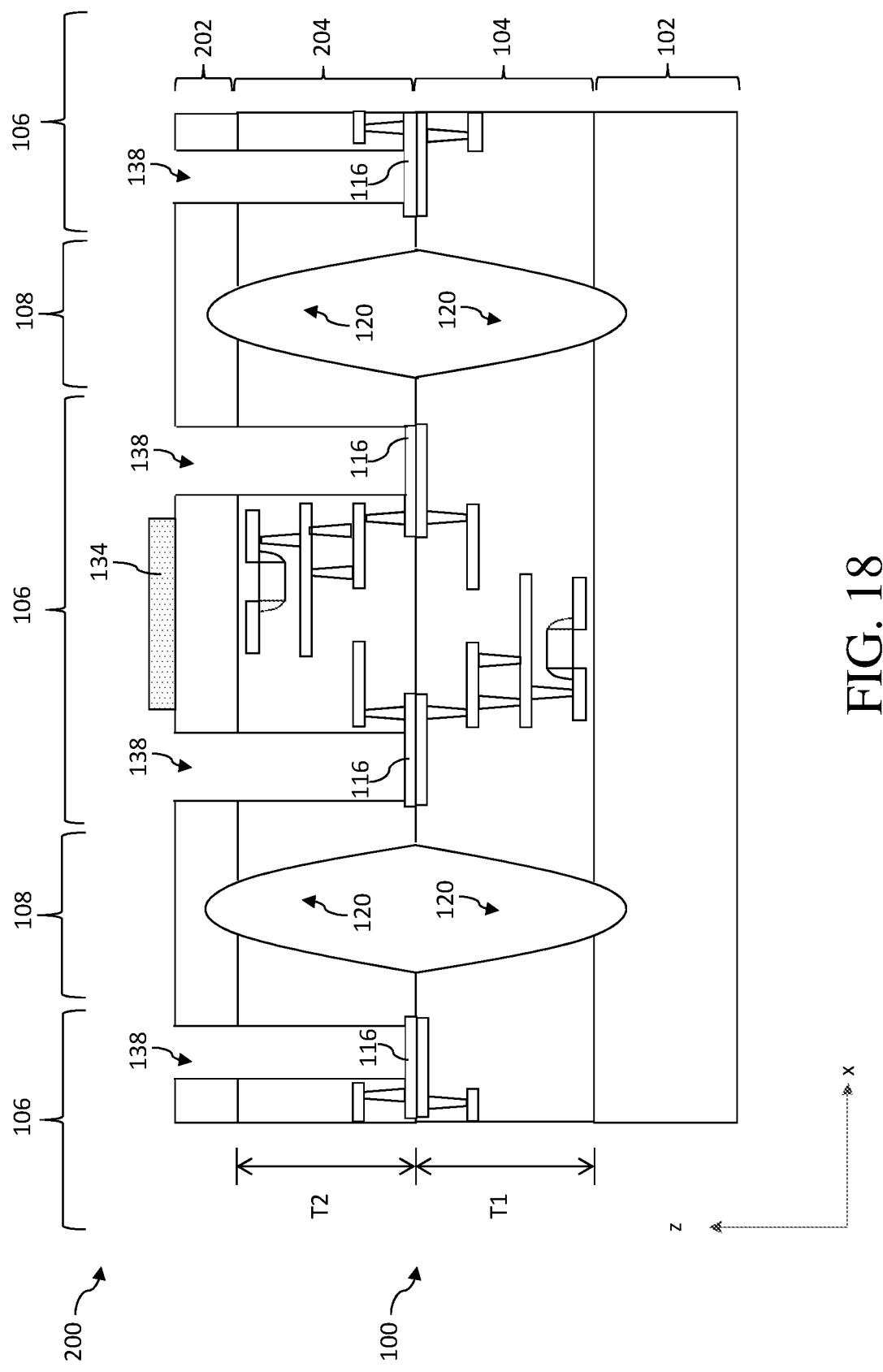

At operation 38, method 10 (FIG. 1C) forms trenches 138 to expose metallic pads 116 (FIG. 18). Trenches 138 are patterned and etched from the backside surface of the substrate 202, through the substrate 202 and the device layer 204, and arrive at the metallic pads 116 designed for receiving bond wires in the illustrate embodiment. Trenches 138 can be regarded as through-silicon vias (TSVs) and metallic pads 116 can be regarded as bondpads.

Figure 19:
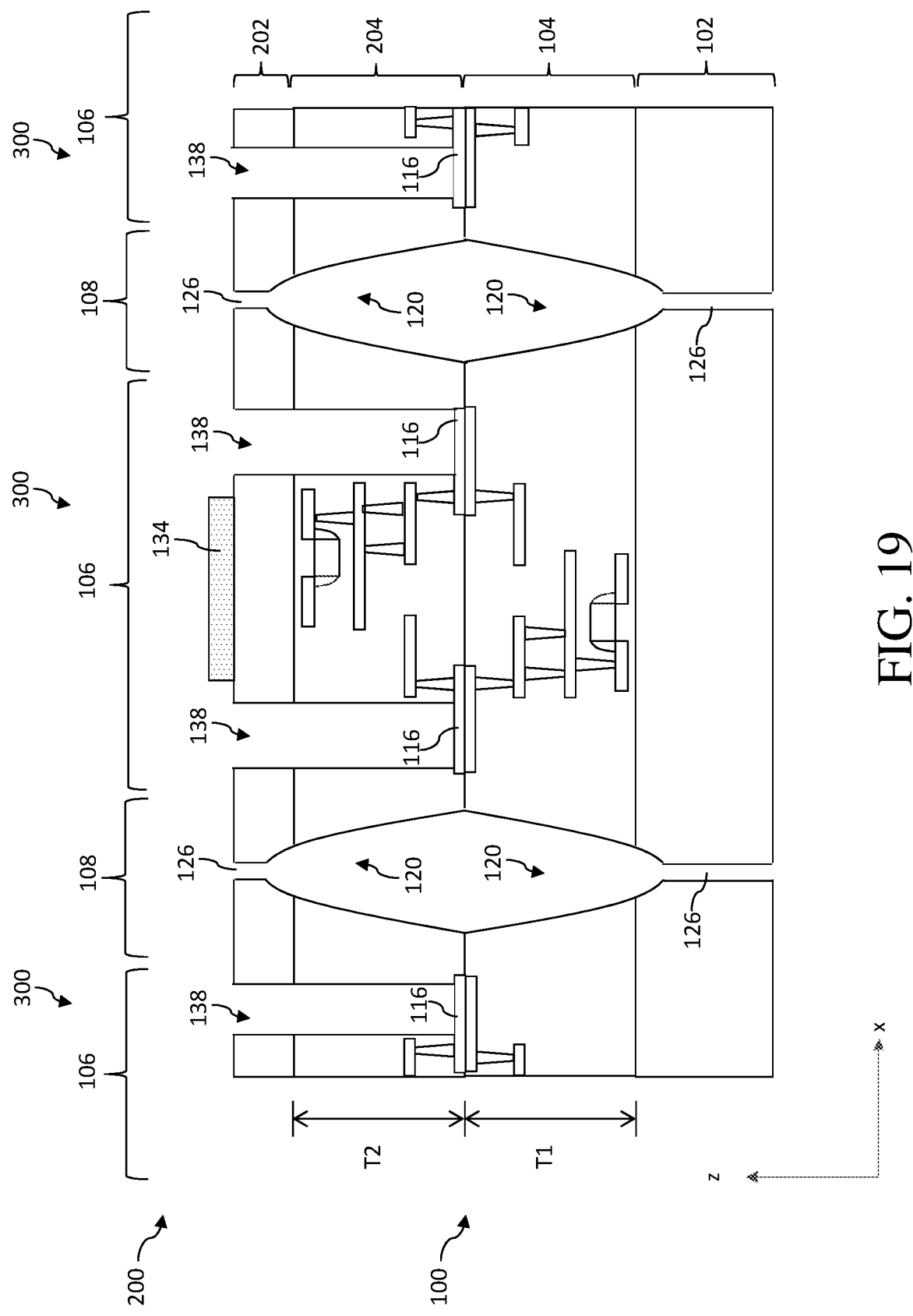

At operation 42, the method 10 (FIG. 1C) cuts along the scribe channel region 108 with a cutting technique other than laser, such as mechanical dicing, to divide the bonded semiconductor structure into two or more dice 300 (FIG. 19). In some embodiments, the mechanical dicing employs a saw or a blade (not shown) to cut through the thinned substrate 202, upper groove 120, lower groove 120, and substrate 102 in sequence. In some alternative embodiments, the saw or blade does not completely cut through the substrate 102, but followed by a mechanical cleaving process to crack the bonded semiconductor structure into dice.

Figure 20:
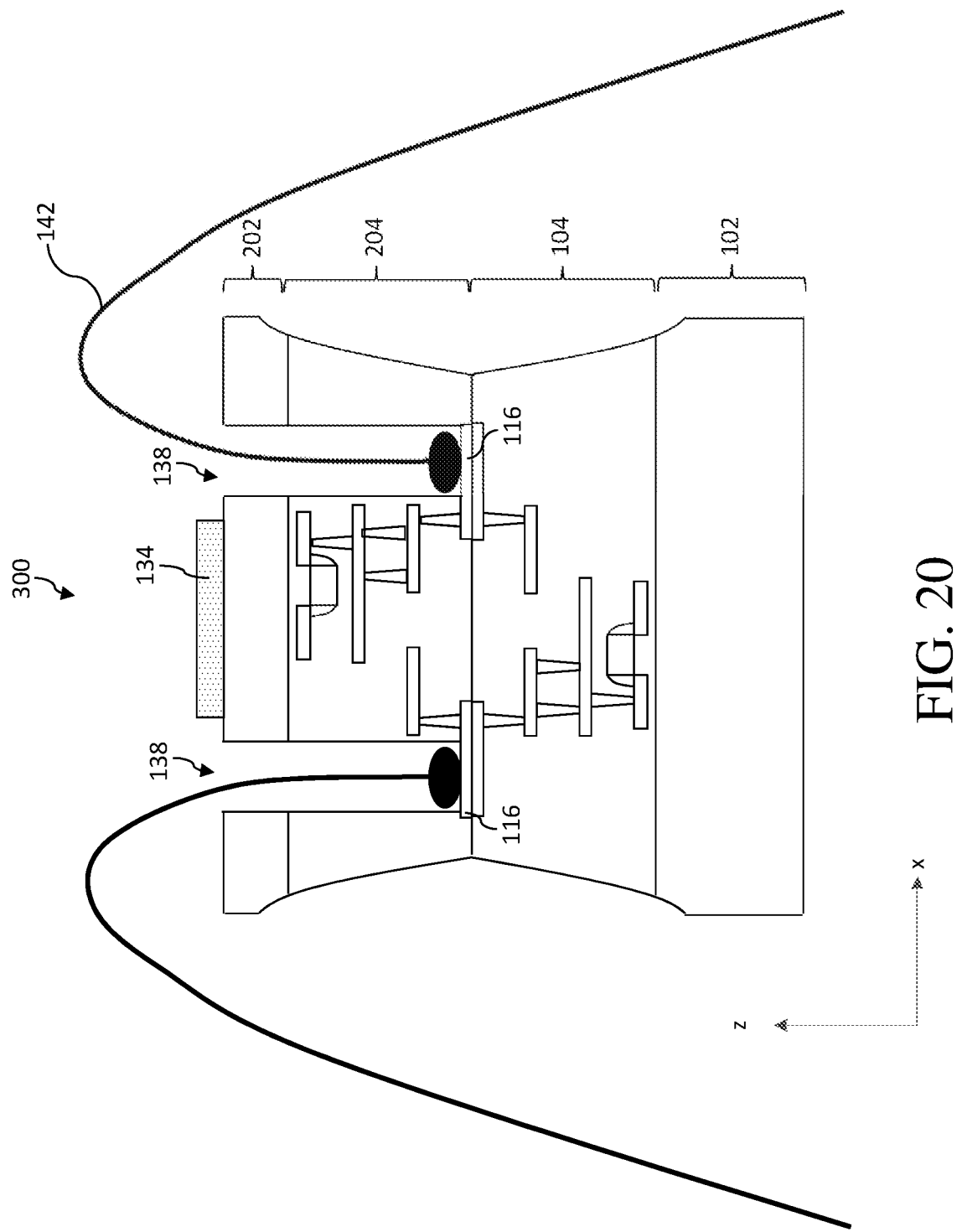

The method 10 (FIG. 1C) may further proceed to other operations to finish the semiconductor IC 300, such as landing bond wires 142 on the bondpads 116 through the trenches 138 to electrically couple circuits in the device layers 104 and 204 externally, such as to a lead frame (FIG. 20).

Figure 21:
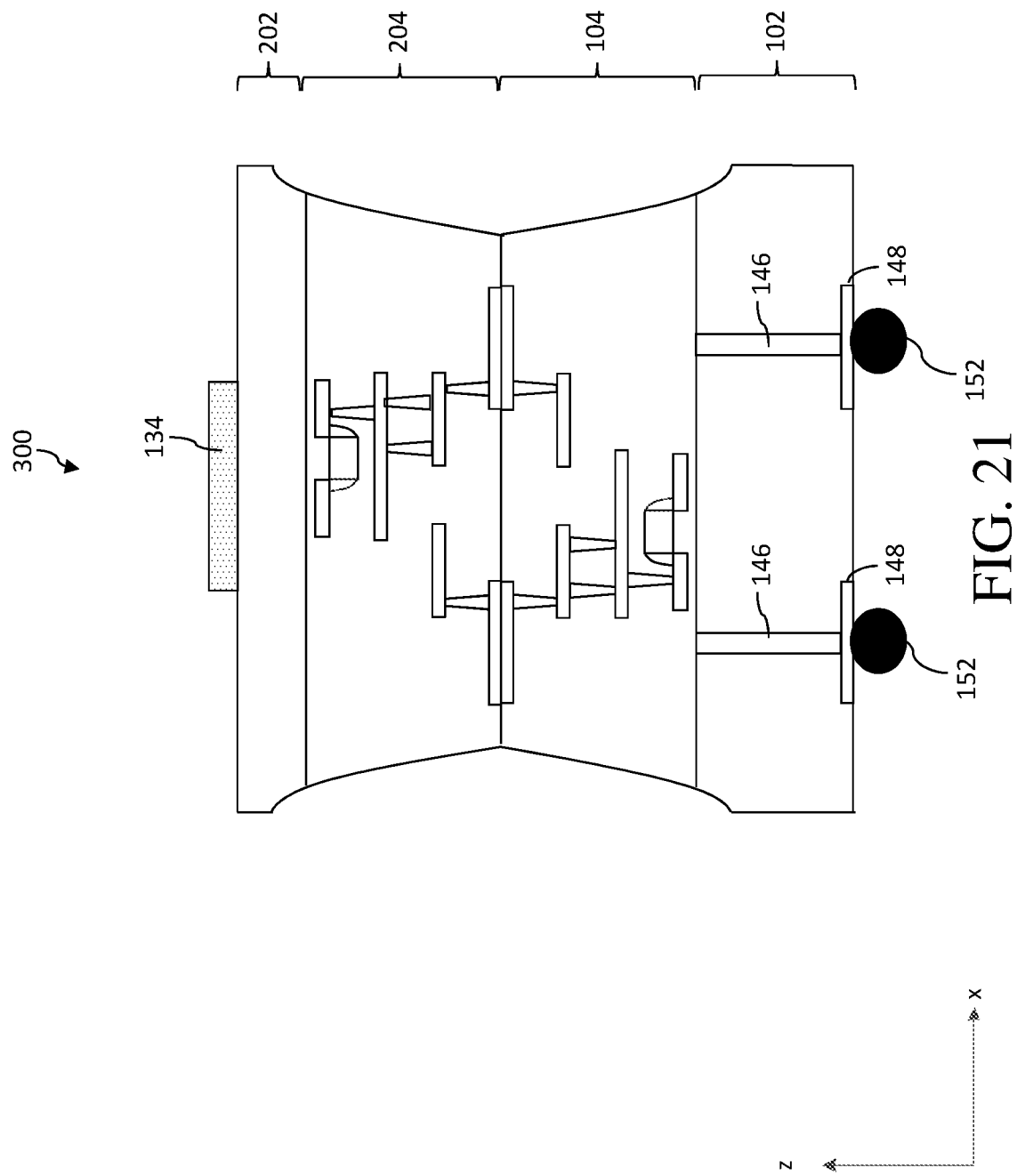
Figure 22:
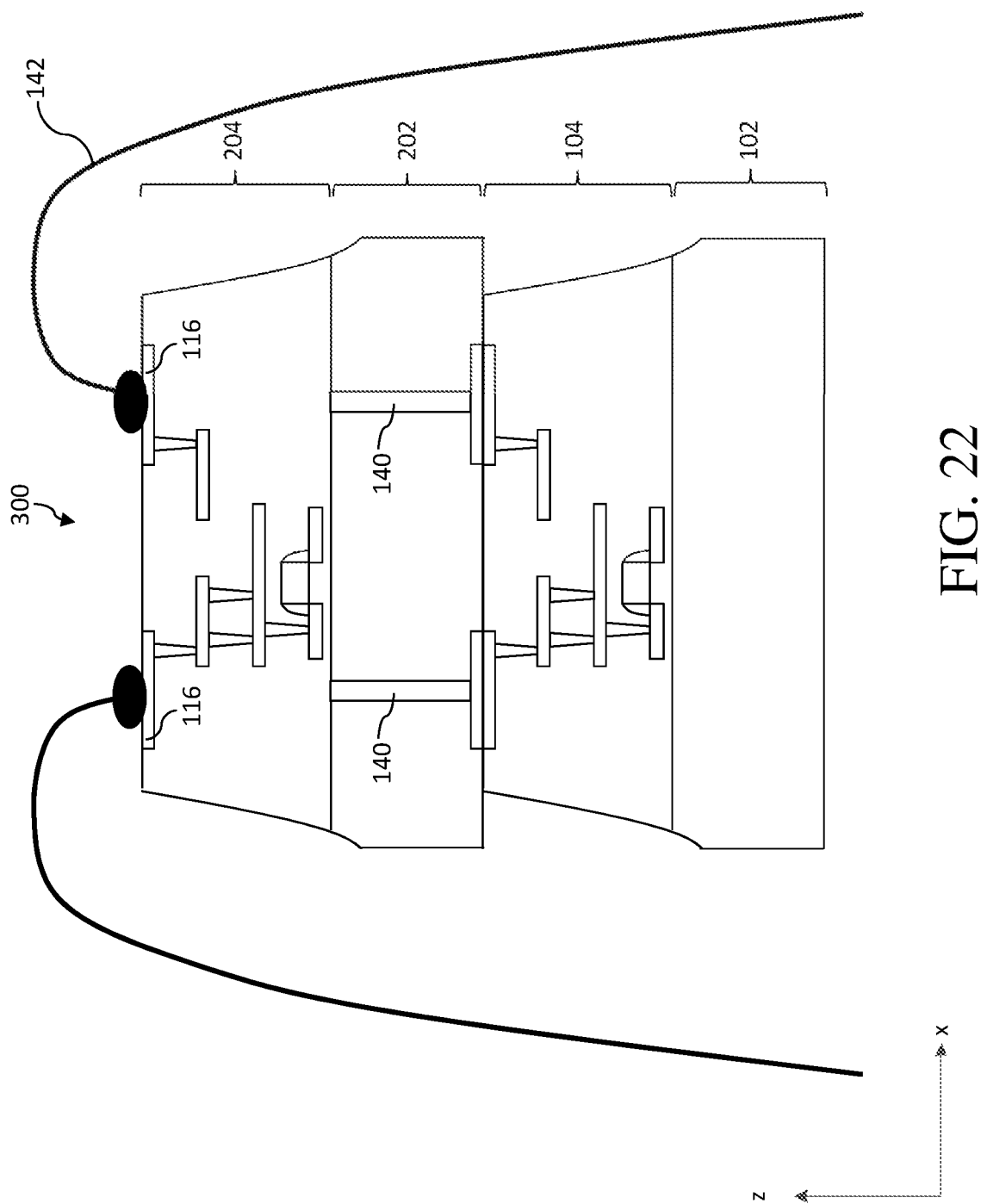

FIG. 21 illustrates another embodiment of the semiconductor IC 300 in forming flip chip bonding to route single paths from bottom of the chip. In the illustrated embodiment, TSVs 146 are formed in the substrate 102 and metallic pads 148 are formed on the bottom surface of the substrate 102. Solder bumps (or Cu bump) 152 are subsequently deposited on the metallic pads 148. FIG. 22 illustrates yet another embodiment of the semiconductor IC 300 in forming wire bonding on the top surface of the device layer 204. In the illustrated embodiment, the substrate 202 directly faces the device layer 104 in the bonding process. TSVs 140 in the substrate 202 provide signal paths from the device layer 204 to the device layer 104. Metallic pads 116 of the device layer 204 are exposed on the top surface of the semiconductor IC 300 to provide landing pad for the bond wires 142. Bond wires 142 electrically couple circuits in the device layers 104 and 204 externally, such as to a lead frame.

Although not limiting, one or more embodiments of the present disclosure offer improvements for stacked semiconductor devices and methods of fabricating the same. For example, embodiments of the present disclosure provide a hybrid dicing process includes a laser grooving process before bonding and then followed by a mechanical dicing, which alleviate the detrimental effects during stack semiconductor devices dicing, such as micro-cracking and silicon debris re-deposition associated with the conventional wafer dicing methods, therefore reducing the dicing-related device damage and improving product yield. Furthermore, formation of the stacked semiconductor devices can be easily integrated into existing semiconductor fabrication processes.

Accordingly, the present disclosure provides many different embodiments for fabricating a semiconductor device. In one exemplary aspect, the present disclosure is directed to a method. The method includes providing first and second wafers; forming a first device layer in a top portion of the first wafer; forming a second device layer in a top portion of the second wafer; forming a first groove in the first device layer; forming a second groove in the second device layer; bonding the first and second wafers together after at least one of the first and second grooves is formed; and dicing the bonded first and second wafers by a cutting process, wherein the cutting process cuts through the first and second grooves. In some embodiments, each of the first and second grooves is formed by a laser grooving process. In some embodiments, the cutting process includes mechanical dicing with a saw or a blade. In some embodiments, after the bonding, the second groove is directly under the first groove. In some embodiments, the first groove extends completely through the first device layer and the second groove extends completely through the second device layer. In some embodiments, after the bonding, the first device layer faces the second device layer, such that a void extends continuously from the first groove to the second groove. In some embodiments, the first device layer includes a first bond pad and the second device layer includes a second bond pad, and wherein the bonding physically joins the first bond pad to the second bond pad. In some embodiments, the method further includes forming a through-substrate-via (TSV) in the second wafer prior to the bonding, such that the TSV electrically couples the second device layer to a bond pad at a bottom surface of the second wafer. In some embodiments, after the bonding, the second device layer faces a bottom surface of the first wafer. In some embodiments, the method further includes forming a through-substrate-via (TSV) in the first wafer prior to the bonding, such that the TSV electrically couples the first device layer to the second device layer after the bonding. In some embodiments, the first groove has a first sidewall, a cut made by the cutting process has a second sidewall, and the first sidewall has a slope smaller than that of the second sidewall.

In another exemplary aspect, the present disclosure is directed to a method of fabricating a stacked semiconductor device. The method includes providing a first structure having a first substrate and a first device layer on the first substrate; providing a second structure having a second substrate and a second device layer on the second substrate; forming a second groove in the second device layer; bonding a bottom surface of the first substrate to a top surface of the second device layer; after the bonding, forming a first groove in the first device layer; and cutting through the first groove, the first substrate, the second groove, and the second substrate in sequence. In some embodiments, each of the first and second grooves is formed by a laser grooving process. In some embodiments, the cutting includes a mechanical dicing with a saw or a blade. In some embodiments, the first groove extends into a top portion of the first substrate and the second groove extends into a top portion of the second substrate. In some embodiments, each of the first and second grooves is along a scribing channel. In some embodiments, the first groove has a first sidewall, the first substrate has a second sidewall formed by the cutting, and the first sidewall has a surface roughness larger than that of the second sidewall.

In yet another exemplary aspect, the present disclosure is directed to a stacked semiconductor device. The stacked semiconductor device includes a first substrate with a first sidewall; a first device layer on the first substrate with a second sidewall, wherein a surface roughness of the second sidewall is larger than that of the first sidewall; and a material layer bonded to the first device layer, wherein the first device layer includes a first conductive feature electrically coupled to a second conductive feature in the material layer. In some embodiments, the surface roughness of the second sidewall is at least five times of that of the first sidewall. In some embodiments, a slope of the second sidewall is smaller than that of the first sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first device including a substrate layer and a device layer, wherein the device layer of the first device includes a first bond pad;
   a second device including a second bond pad with a first surface bonded to the first bond pad of the device layer of the first device, wherein the second device includes a trench exposing a second surface of the second bond pad which is opposing the first surface of the second bond pad, p1 wherein the first device has a first sidewall distal to the second device and a second sidewall comprising a part that is proximal to the second device, the first sidewall intersects the second sidewall at an edge of the first device, the edge is located between a bottom surface of the substrate layer facing away from the device layer and a top surface of the substrate layer facing the device layer, the second sidewall comprises a portion of a sidewall of the substrate layer extending from the top surface of the substrate layer to the edge, the portion of the sidewall of the substrate layer is exposed, and a surface roughness of the second sidewall is larger than a surface roughness of the first sidewall; and
   a bonding wire, wherein a first portion of the bonding wire is in the trench and a second portion of the bonding wire extends out of the trench and suspended above the second device.

2. The semiconductor structure of claim 1, wherein a slope of the second sidewall with respect to a bottom surface of the first device is smaller than a slope of the first sidewall.

3. The semiconductor structure of claim 1, wherein the first sidewall is substantially vertical with respect to a bottom surface of the first device and the second sidewall is tapered with respect to the first sidewall.

4. The semiconductor structure of claim 3, wherein an angle formed between the second sidewall and the bottom surface of the first device ranges from about 35° to about 80°.

5. The semiconductor structure of claim 1, wherein the surface roughness of the second sidewall is at least five times of the surface roughness of the first sidewall.

6. The semiconductor structure of claim 1, wherein the second device has a third sidewall proximal to the first device and a fourth sidewall comprising a part that is distal to the first device, and wherein a surface roughness of the third sidewall is different from a surface roughness of the fourth sidewall.

7. The semiconductor structure of claim 6, wherein the surface roughness of the third sidewall is larger than the surface roughness of the fourth sidewall.

8. The semiconductor structure of claim 6, wherein a slope of the third sidewall with respect to a bottom surface of the first device is smaller than a slope of the fourth sidewall.

9. A stacked semiconductor device, comprising:
   a first die including a first semiconductor substrate and a first device layer disposed on the first semiconductor substrate;
   a second die bonded to the first device layer of the first die, wherein the first device layer of the first die includes a first conductive feature in physical contact with and electrically coupled to a second conductive feature in the second die, and wherein the second die includes a trench exposing the second conductive feature; and a bonding wire in physical contact with the second conductive feature and extending through the trench, wherein the bonding wire is free of physical contact with the first conductive feature, wherein the first die includes a first sidewall that is distal to the second die and a second sidewall comprising a part that is proximal to the second die, a slope of the second sidewall with respect to a bottom surface of the first semiconductor substrate is smaller than that of the first sidewall, the second sidewall comprises an end of an interface between the first semiconductor substrate and the first device layer, and the end of the interface is exposed.

10. The stacked semiconductor device of claim 9, wherein a surface roughness of the second sidewall is larger than that of the first sidewall.

11. The stacked semiconductor device of claim 9, wherein the second conductive feature is a bond pad with a bottom surface in physical contact with a top surface of the first device layer.

12. The stacked semiconductor device of claim 9, wherein the second die includes a color filter.

13. The stacked semiconductor device of claim 9, wherein the second die includes a second semiconductor substrate and a second device layer, the second die includes a third sidewall distal to the first die and a fourth sidewall comprising a part that is proximal to the first die, and a slope of the fourth sidewall with respect to the bottom surface of the first semiconductor substrate is smaller than that of the third sidewall.

14. The stacked semiconductor device of claim 13, wherein a surface roughness of the fourth sidewall is larger than that of the third sidewall.

15. A semiconductor device, comprising:
a first semiconductor structure, comprising:
a first semiconductor substrate; and
a first device layer disposed on the first semiconductor substrate, the first device layer including a first surface facing the first semiconductor substrate and a second surface facing away from the first semiconductor substrate, wherein the first device layer including a first bond pad;

a second semiconductor structure, comprising:
a second semiconductor substrate; and
a second device layer disposed under the second semiconductor substrate, the second device layer including a first surface facing the second semiconductor substrate and a second surface facing away from the second semiconductor substrate, wherein the second device layer including a second bond pad in physical contact with the first bond pad and a trench exposing a surface of the second bond pad which is facing away from the first bond pad, wherein the second semiconductor structure is bonded to the first semiconductor structure through the second surface of the second device layer and the second surface of the first device layer, the second surface of the first device layer is smaller than the first surface of the first device layer, the second surface of the second device layer is smaller than the first surface of the second device layer, and the second surface of the first device layer is larger than the second surface of the second device layer; and a bonding wire extending through the trench.

16. The semiconductor device of claim 15, wherein the first device layer includes a first conductive feature, and wherein the second device layer includes a second conductive feature having a first surface bonded to the first conductive feature and a second surface bonded to a bond wire.

17. The semiconductor device of claim 15, further comprising:
a color filter disposed on the second semiconductor substrate.

18. The semiconductor device of claim 15, wherein the first semiconductor substrate has a first sidewall, and the first device layer has a second sidewall with a slope with respect to a bottom surface of the first semiconductor substrate smaller than that of the first sidewall.

19. The semiconductor device of claim 15, wherein the first semiconductor substrate has a first sidewall, and the first device layer has a second sidewall with a surface roughness larger than that of the first sidewall.

20. The semiconductor device of claim 15,
wherein the bond wire is in physical contact with the surface of the second bond pad and free of physical contact with a sidewall of the trench.

* * * * *